(12) United States Patent  
Kato et al.

(10) Patent No.: US 8,552,870 B2
(45) Date of Patent: *Oct. 8, 2013

(54) WIRELESS IC DEVICE

(75) Inventors: Noboru Kato, Moriyama (JP); Nobuo Ikemoto, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/470,486

(22) Filed: May 14, 2012

(65) Prior Publication Data

US 2012/0223148 A1    Sep. 6, 2012

Related U.S. Application Data

(63) Continuation of application No. 12/390,556, filed on Feb. 23, 2009, now Pat. No. 8,193,939, which is a continuation of application No. PCT/JP2008/061955, filed on Jul. 2, 2008.

(30) Foreign Application Priority Data

Jul. 9, 2007  (JP) ................... 2007-179332
Oct. 10, 2007  (JP) ................... 2007-264603
Apr. 14, 2008  (JP) ................... 2008-105189

(51) Int. Cl.
*G08B 13/14*    (2006.01)
*H04Q 5/22*    (2006.01)
*H01Q 7/08*    (2006.01)
*G01V 3/10*    (2006.01)

(52) U.S. Cl.
USPC ............ 340/572.7; 340/572.1; 340/10.1; 340/586.1; 340/505; 340/539.17; 343/788; 343/702; 324/326

(58) Field of Classification Search
USPC ........................................ 340/572.7
See application file for complete search history.

(56) References Cited

U.S. PATENT DOCUMENTS 3,364,564 A  1/1968 Kurtz et al.
4,794,397 A  12/1988 Ohe et al.
(Continued)

FOREIGN PATENT DOCUMENTS

CA    2 279 176 A1    7/1998
DE    10 2006 057 369 A1    6/2008
(Continued)

OTHER PUBLICATIONS

Official communication issued in counterpart European Application No. 08 77 7758, dated on Jun. 30, 2009.

(Continued)

*Primary Examiner* — Jennifer Mehmood
*Assistant Examiner* — Fekadeselassie Girma
(74) *Attorney, Agent, or Firm* — Keating & Bennett, LLP

(57) ABSTRACT

A wireless-IC-device main component is disposed on a surface opposite to a surface for receiving signals from a reader/writer. The wireless-IC-device main component includes an insulating substrate, which is provided with a loop electrode and an electromagnetically coupled module coupled to the loop electrode. A signal from the reader/writer causes an eddy current to flow across a conductor principal plane of a metal article. The eddy current causes a magnetic field to be generated in a direction perpendicular or substantially perpendicular to the conductor principal plane of the metal article. Then, the loop electrode is coupled to the magnetic field. Thus, the wireless-IC-device main component functions as an RFID tag even for signals from the principal plane opposite to the wireless-IC-device main component. Thus, it is possible to reduce the cost of manufacturing a metal article, and to provide a wireless IC device using the metal article as a radiator.

13 Claims, 18 Drawing Sheets

(56) References Cited

U.S. PATENT DOCUMENTS

| | | |
|---|---|---|
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |
| 5,491,483 A | 2/1996 | D'Hont |
| 5,528,222 A | 6/1996 | Moskowitz et al. |
| 5,757,074 A | 5/1998 | Matloubian et al. |
| 5,854,480 A | 12/1998 | Noto |
| 5,903,239 A | 5/1999 | Takahashi et al. |
| 5,936,150 A | 8/1999 | Kobrin et al. |
| 5,955,723 A | 9/1999 | Reiner |
| 5,995,006 A | 11/1999 | Walsh |
| 6,104,311 A | 8/2000 | Lastinger |
| 6,107,920 A | 8/2000 | Eberhardt et al. |
| 6,172,608 B1 | 1/2001 | Cole |
| 6,181,287 B1 | 1/2001 | Beigel |
| 6,190,942 B1 | 2/2001 | Wilm et al. |
| 6,243,045 B1 | 6/2001 | Ishibashi |
| 6,249,258 B1 | 6/2001 | Bloch et al. |
| 6,259,369 B1 | 7/2001 | Monico |
| 6,271,803 B1 | 8/2001 | Watanabe et al. |
| 6,335,686 B1 | 1/2002 | Goff et al. |
| 6,362,784 B1 | 3/2002 | Kane et al. |
| 6,367,143 B1 | 4/2002 | Sugimura |
| 6,378,774 B1 | 4/2002 | Emori et al. |
| 6,406,990 B1 | 6/2002 | Kawai |
| 6,448,874 B1 | 9/2002 | Shiino et al. |
| 6,452,563 B1 | 9/2002 | Porte |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,812,707 B2 | 11/2004 | Yonezawa et al. |
| 6,828,881 B2 | 12/2004 | Mizutani et al. |
| 6,837,438 B1 | 1/2005 | Takasugi et al. |
| 6,861,731 B2 | 3/2005 | Buijsman et al. |
| 6,927,738 B2 | 8/2005 | Senba et al. |
| 6,956,481 B1 | 10/2005 | Cole |
| 6,963,729 B2 | 11/2005 | Uozumi |
| 7,088,249 B2 | 8/2006 | Senba et al. |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,405,664 B2 | 7/2008 | Sakama et al. |
| 2002/0011967 A1 | 1/2002 | Goff et al. |
| 2002/0015002 A1 | 2/2002 | Yasukawa et al. |
| 2002/0044092 A1 | 4/2002 | Kushihi |
| 2002/0067316 A1 | 6/2002 | Yokoshima et al. |
| 2002/0093457 A1 | 7/2002 | Hamada et al. |
| 2003/0006901 A1 | 1/2003 | Kim et al. |
| 2003/0020661 A1 | 1/2003 | Sato |
| 2003/0045324 A1 | 3/2003 | Nagumo et al. |
| 2003/0169153 A1 | 9/2003 | Muller |
| 2004/0001027 A1 | 1/2004 | Killen et al. |
| 2004/0026519 A1 | 2/2004 | Usami et al. |
| 2004/0056823 A1 | 3/2004 | Zuk et al. |
| 2004/0066617 A1 | 4/2004 | Hirabayashi et al. |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2004/0252064 A1 | 12/2004 | Yuanzhu |
| 2004/0257295 A1 | 12/2004 | Tada |
| 2005/0092836 A1 | 5/2005 | Kudo |
| 2005/0099337 A1 | 5/2005 | Takei et al. |
| 2005/0125093 A1 | 6/2005 | Kikuchi et al. |
| 2005/0134460 A1 | 6/2005 | Usami |
| 2005/0134506 A1 | 6/2005 | Egbert |
| 2005/0138798 A1 | 6/2005 | Sakama et al. |
| 2005/0140512 A1 | 6/2005 | Sakama et al. |
| 2005/0232412 A1 | 10/2005 | Ichihara et al. |
| 2005/0236623 A1 | 10/2005 | Takechi et al. |
| 2005/0264422 A1* | 12/2005 | Watanabe et al. ........... 340/572.7 |
| 2005/0275539 A1 | 12/2005 | Sakama et al. |
| 2006/0001138 A1* | 1/2006 | Sakama et al. ................ 257/678 |
| 2006/0032926 A1 | 2/2006 | Baba et al. |
| 2006/0044192 A1 | 3/2006 | Egbert |
| 2006/0055531 A1 | 3/2006 | Cook et al. |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0145872 A1 | 7/2006 | Tanaka et al. |
| 2006/0158380 A1 | 7/2006 | Son et al. |
| 2006/0170606 A1 | 8/2006 | Yamagajo et al. |
| 2006/0214801 A1 | 9/2006 | Murofushi et al. |
| 2006/0220871 A1 | 10/2006 | Baba et al. |
| 2006/0244568 A1 | 11/2006 | Tong et al. |
| 2006/0244676 A1 | 11/2006 | Uesaka |
| 2006/0267138 A1 | 11/2006 | Kobayashi |
| 2007/0004028 A1 | 1/2007 | Lair et al. |
| 2007/0018893 A1 | 1/2007 | Kai et al. |
| 2007/0040028 A1 | 2/2007 | Kawamata |
| 2007/0052613 A1 | 3/2007 | Gallschuetz et al. |
| 2007/0057854 A1 | 3/2007 | Oodachi et al. |
| 2007/0069037 A1 | 3/2007 | Kawai |
| 2007/0132591 A1 | 6/2007 | Khatri |
| 2007/0164414 A1 | 7/2007 | Dokai et al. |
| 2007/0200782 A1 | 8/2007 | Hayama et al. |
| 2007/0229276 A1 | 10/2007 | Yamagajo et al. |
| 2007/0247387 A1 | 10/2007 | Kubo et al. |
| 2007/0252700 A1 | 11/2007 | Ishihara et al. |
| 2007/0252703 A1 | 11/2007 | Kato et al. |
| 2007/0285335 A1* | 12/2007 | Bungo et al. ................... 343/895 |
| 2007/0290928 A1 | 12/2007 | Chang et al. |
| 2008/0024156 A1* | 1/2008 | Arai et al. ..................... 324/765 |
| 2008/0070003 A1 | 3/2008 | Nakatani et al. |
| 2008/0087990 A1 | 4/2008 | Kato et al. |
| 2008/0143630 A1 | 6/2008 | Kato et al. |
| 2008/0169905 A1* | 7/2008 | Slatter .......................... 340/10.1 |
| 2008/0184281 A1 | 7/2008 | Ashizaki et al. |
| 2008/0272885 A1 | 11/2008 | Atherton |
| 2009/0002130 A1 | 1/2009 | Kato |
| 2009/0009007 A1 | 1/2009 | Kato et al. |
| 2009/0021352 A1 | 1/2009 | Kataya et al. |
| 2009/0021446 A1 | 1/2009 | Kataya et al. |
| 2009/0065594 A1 | 3/2009 | Kato et al. |
| 2009/0109102 A1 | 4/2009 | Dokai et al. |
| 2009/0160719 A1 | 6/2009 | Kato et al. |
| 2009/0201116 A1 | 8/2009 | Orihara |
| 2009/0224061 A1 | 9/2009 | Kato et al. |
| 2009/0231106 A1 | 9/2009 | Okamura |
| 2009/0262041 A1 | 10/2009 | Ikemoto et al. |
| 2009/0266900 A1 | 10/2009 | Ikemoto et al. |
| 2009/0278687 A1 | 11/2009 | Kato |
| 2009/0321527 A1 | 12/2009 | Kato et al. |
| 2010/0103058 A1 | 4/2010 | Kato et al. |
| 2010/0182210 A1 | 7/2010 | Ryou et al. |
| 2010/0245046 A1* | 9/2010 | Stevens et al. ................ 340/10.1 |
| 2010/0308118 A1 | 12/2010 | Kataya et al. |
| 2011/0031320 A1 | 2/2011 | Kato et al. |
| 2011/0063184 A1 | 3/2011 | Furumura et al. |

FOREIGN PATENT DOCUMENTS

| | | |
|---|---|---|
| EP | 0 694 874 A2 | 1/1996 |
| EP | 0 848 448 A2 | 6/1998 |
| EP | 0 948 083 A2 | 10/1999 |
| EP | 0 977 145 A2 | 2/2000 |
| EP | 1 010 543 A1 | 6/2000 |
| EP | 1 085 480 A1 | 3/2001 |
| EP | 1 160 915 A2 | 12/2001 |
| EP | 1 170 795 A2 | 1/2002 |
| EP | 1 193 793 A2 | 4/2002 |
| EP | 1 227 540 A1 | 7/2002 |
| EP | 1 280 232 A1 | 1/2003 |
| EP | 1 280 350 A1 | 1/2003 |
| EP | 1 343 223 A1 | 9/2003 |
| EP | 1 357 511 A2 | 10/2003 |

| | | | | | | |
|---|---|---|---|---|---|---|
| EP | 1 547 753 A1 | 6/2005 | | JP | 11-149537 A | 6/1999 |
| EP | 1 548 872 A1 | 6/2005 | | JP | 11-149538 A | 6/1999 |
| EP | 1 626 364 A2 | 2/2006 | | JP | 11-175678 A | 7/1999 |
| EP | 1 701 296 A1 | 9/2006 | | JP | 11-219420 A | 8/1999 |
| EP | 1 703 589 A1 | 9/2006 | | JP | 11-220319 A | 8/1999 |
| EP | 1 742 296 A1 | 1/2007 | | JP | 11-282993 A | 10/1999 |
| EP | 1 744 398 A1 | 1/2007 | | JP | 11-328352 A | 11/1999 |
| EP | 1 840 802 A1 | 10/2007 | | JP | 11-331014 A | 11/1999 |
| EP | 1 841 005 A1 | 10/2007 | | JP | 11-346114 A | 12/1999 |
| EP | 1 865 574 A1 | 12/2007 | | JP | 11-515094 A | 12/1999 |
| EP | 1 887 652 A1 | 2/2008 | | JP | 2000-21128 A | 1/2000 |
| EP | 1 976 056 A1 | 10/2008 | | JP | 2000-021639 A | 1/2000 |
| EP | 1 988 491 A1 | 11/2008 | | JP | 2000-022421 A | 1/2000 |
| EP | 1 988 601 A1 | 11/2008 | | JP | 2000-059260 A | 2/2000 |
| EP | 1 993 170 A1 | 11/2008 | | JP | 2000-085283 A | 3/2000 |
| EP | 2 009 738 A1 | 12/2008 | | JP | 2000-090207 A | 3/2000 |
| EP | 2 012 258 A1 | 1/2009 | | JP | 2000-132643 A | 5/2000 |
| EP | 2 096 709 A1 | 9/2009 | | JP | 2000-137778 A | 5/2000 |
| EP | 2 148 449 A1 | 1/2010 | | JP | 2000-137779 A | 5/2000 |
| EP | 2 166 617 A1 | 3/2010 | | JP | 2000-137785 A | 5/2000 |
| EP | 2 251 934 A1 | 11/2010 | | JP | 2000-148948 A | 5/2000 |
| EP | 2 330 684 A1 | 6/2011 | | JP | 2000-172812 A | 6/2000 |
| GB | 2 305 075 A | 3/1997 | | JP | 2000-209013 A | 7/2000 |
| GB | 2461443 A | 1/2010 | | JP | 2000-222540 A | 8/2000 |
| JP | 50-143451 A | 11/1975 | | JP | 2000-510271 A | 8/2000 |
| JP | 61-284102 A | 12/1986 | | JP | 2000-242754 A | 9/2000 |
| JP | 62-127140 U | 8/1987 | | JP | 2000-243797 A | 9/2000 |
| JP | 02-164105 A | 6/1990 | | JP | 2000-251049 A | 9/2000 |
| JP | 02-256208 A | 10/1990 | | JP | 2000-261230 A | 9/2000 |
| JP | 3-171385 A | 7/1991 | | JP | 2000-276569 A | 10/2000 |
| JP | 03-503467 A | 8/1991 | | JP | 2000-286634 A | 10/2000 |
| JP | 03-262313 A | 11/1991 | | JP | 2000-286760 A | 10/2000 |
| JP | 04-150011 A | 5/1992 | | JP | 2000-311226 A | 11/2000 |
| JP | 04-167500 A | 6/1992 | | JP | 2000-321984 A | 11/2000 |
| JP | 04-096814 U | 8/1992 | | JP | 2000-349680 A | 12/2000 |
| JP | 04-101168 U | 9/1992 | | JP | 2001-10264 A | 1/2001 |
| JP | 04-134807 U | 12/1992 | | JP | 2001-028036 A | 1/2001 |
| JP | 05-327331 A | 12/1993 | | JP | 2001-043340 A | 2/2001 |
| JP | 6-53733 A | 2/1994 | | JP | 3075400 U | 2/2001 |
| JP | 06-077729 A | 3/1994 | | JP | 2001-66990 A | 3/2001 |
| JP | 06-177635 A | 6/1994 | | JP | 2001-76111 A | 3/2001 |
| JP | 6-260949 A | 9/1994 | | JP | 2001-084463 A | 3/2001 |
| JP | 07-183836 A | 7/1995 | | JP | 2001-101369 A | 4/2001 |
| JP | 08-055725 A | 2/1996 | | JP | 2001-505682 A | 4/2001 |
| JP | 08-056113 A | 2/1996 | | JP | 2001-168628 A | 6/2001 |
| JP | 8-87580 A | 4/1996 | | JP | 2001-188890 A | 7/2001 |
| JP | 08-088586 A | 4/1996 | | JP | 2001-240046 A | 9/2001 |
| JP | 08-88586 A | 4/1996 | | JP | 2001-240217 A | 9/2001 |
| JP | 08-176421 A | 7/1996 | | JP | 2001-256457 A | 9/2001 |
| JP | 08-180160 A | 7/1996 | | JP | 2001-257292 A | 9/2001 |
| JP | 08-279027 A | 10/1996 | | JP | 2001-514777 A | 9/2001 |
| JP | 08-307126 A | 11/1996 | | JP | 2001-291181 A | 10/2001 |
| JP | 08-330372 A | 12/1996 | | JP | 2001-319380 A | 11/2001 |
| JP | 09-014150 A | 1/1997 | | JP | 2001-331976 A | 11/2001 |
| JP | 09-035025 A | 2/1997 | | JP | 2001-332923 A | 11/2001 |
| JP | 09-093029 A | 4/1997 | | JP | 2001-339226 A | 12/2001 |
| JP | 9-93029 A | 4/1997 | | JP | 2001-344574 A | 12/2001 |
| JP | 09-245381 A | 9/1997 | | JP | 2001-351083 A | 12/2001 |
| JP | 09-252217 A | 9/1997 | | JP | 2001-351084 A | 12/2001 |
| JP | 09-270623 A | 10/1997 | | JP | 2001-352176 A | 12/2001 |
| JP | 09-284038 A | 10/1997 | | JP | 2001-358527 A | 12/2001 |
| JP | 9-512367 A | 12/1997 | | JP | 2002-024776 A | 1/2002 |
| JP | 10-69533 A | 3/1998 | | JP | 2002-026513 A | 1/2002 |
| JP | 10-069533 A | 3/1998 | | JP | 2002-32731 A | 1/2002 |
| JP | 10-505466 A | 5/1998 | | JP | 2002-042076 A | 2/2002 |
| JP | 10-171954 A | 6/1998 | | JP | 2002-063557 A | 2/2002 |
| JP | 10-173427 A | 6/1998 | | JP | 2002-505645 A | 2/2002 |
| JP | 10-193849 A | 7/1998 | | JP | 2002-76750 A | 3/2002 |
| JP | 10-193851 A | 7/1998 | | JP | 2002-076750 A | 3/2002 |
| JP | 10-293828 A | 11/1998 | | JP | 2002-111363 A | 4/2002 |
| JP | 10-334203 A | 12/1998 | | JP | 2002-150245 A | 5/2002 |
| JP | 11-025244 A | 1/1999 | | JP | 2002-157564 A | 5/2002 |
| JP | 11-039441 A | 2/1999 | | JP | 2002-158529 A | 5/2002 |
| JP | 11-075329 A | 3/1999 | | JP | 2002-175508 A | 6/2002 |
| JP | 11-085937 A | 3/1999 | | JP | 2002-183676 A | 6/2002 |
| JP | 11-88241 A | 3/1999 | | JP | 2002-183690 A | 6/2002 |
| JP | 11-102424 A | 4/1999 | | JP | 2002-185358 A | 6/2002 |
| JP | 11-103209 A | 4/1999 | | JP | 2002-204117 A | 7/2002 |
| JP | 11-149536 A | 6/1999 | | JP | 2002-521757 A | 7/2002 |

| | | | | | | |
|---|---|---|---|---|---|---|
| JP | 2002-522849 A | 7/2002 | | JP | 2004-253858 A | 9/2004 |
| JP | 2002-230128 A | 8/2002 | | JP | 2004-527864 A | 9/2004 |
| JP | 2002-232221 A | 8/2002 | | JP | 2004-280390 A | 10/2004 |
| JP | 2002-246828 A | 8/2002 | | JP | 2004-282403 A | 10/2004 |
| JP | 2002-252117 A | 9/2002 | | JP | 2004-287767 A | 10/2004 |
| JP | 2002-259934 A | 9/2002 | | JP | 2004-295297 A | 10/2004 |
| JP | 2002-280821 A | 9/2002 | | JP | 2004-297249 A | 10/2004 |
| JP | 2002-298109 A | 10/2002 | | JP | 2004-297681 A | 10/2004 |
| JP | 2002-308437 A | 10/2002 | | JP | 2004-304370 A | 10/2004 |
| JP | 2002-319008 A | 10/2002 | | JP | 2004-312112 A | 11/2004 |
| JP | 2002-319009 A | 10/2002 | | JP | 2004-319848 A | 11/2004 |
| JP | 2002-319812 A | 10/2002 | | JP | 2004-326380 A | 11/2004 |
| JP | 2002-362613 A | 12/2002 | | JP | 2004-334268 A | 11/2004 |
| JP | 2002-366917 A | 12/2002 | | JP | 2004-336250 A | 11/2004 |
| JP | 2002-373029 A | 12/2002 | | JP | 2004-343000 A | 12/2004 |
| JP | 2002-373323 A | 12/2002 | | JP | 2004-362190 A | 12/2004 |
| JP | 2002-374139 A | 12/2002 | | JP | 2004-362341 A | 12/2004 |
| JP | 2003-006599 A | 1/2003 | | JP | 2004-362602 A | 12/2004 |
| JP | 2003-016412 A | 1/2003 | | JP | 2005-5866 A | 1/2005 |
| JP | 2003-022912 A | 1/2003 | | JP | 2005-18156 A | 1/2005 |
| JP | 2003-026177 A | 1/2003 | | JP | 2005-033461 A | 2/2005 |
| JP | 2003-030612 A | 1/2003 | | JP | 2005-124061 A | 5/2005 |
| JP | 2003-037861 A | 2/2003 | | JP | 2005-128592 A | 5/2005 |
| JP | 2003-44789 A | 2/2003 | | JP | 2005-129019 A | 5/2005 |
| JP | 2003-046318 A | 2/2003 | | JP | 2005-135132 A | 5/2005 |
| JP | 2003-58840 A | 2/2003 | | JP | 2005-136528 A | 5/2005 |
| JP | 2003-067711 A | 3/2003 | | JP | 2005-137032 A | 5/2005 |
| JP | 2003-069335 A | 3/2003 | | JP | 3653099 B2 | 5/2005 |
| JP | 2003-076947 A | 3/2003 | | JP | 2005-165839 A | 6/2005 |
| JP | 2003-76963 A | 3/2003 | | JP | 2005-167327 A | 6/2005 |
| JP | 2003-78333 A | 3/2003 | | JP | 2005-167813 A | 6/2005 |
| JP | 2003-078336 A | 3/2003 | | JP | 2005-190417 A | 7/2005 |
| JP | 2003-085501 A | 3/2003 | | JP | 2005-191705 A | 7/2005 |
| JP | 2003-085520 A | 3/2003 | | JP | 2005-192124 A | 7/2005 |
| JP | 2003-87008 A | 3/2003 | | JP | 2005-204038 A | 7/2005 |
| JP | 2003-87044 A | 3/2003 | | JP | 2005-210223 A | 8/2005 |
| JP | 2003-099184 A | 4/2003 | | JP | 2005-210676 A | 8/2005 |
| JP | 2003-099720 A | 4/2003 | | JP | 2005-210680 A | 8/2005 |
| JP | 2003-099721 A | 4/2003 | | JP | 2005-217822 A | 8/2005 |
| JP | 2003-110344 A | 4/2003 | | JP | 2005-229474 A | 8/2005 |
| JP | 2003-132330 A | 5/2003 | | JP | 2005-236339 A | 9/2005 |
| JP | 2003-134007 A | 5/2003 | | JP | 2005-244778 A | 9/2005 |
| JP | 2003-155062 A | 5/2003 | | JP | 2005-252853 A | 9/2005 |
| JP | 2003-158414 A | 5/2003 | | JP | 2005-275870 A | 10/2005 |
| JP | 2003-168760 A | 6/2003 | | JP | 2005-284352 A | 10/2005 |
| JP | 2003-179565 A | 6/2003 | | JP | 2005-284455 A | 10/2005 |
| JP | 2003-187207 A | 7/2003 | | JP | 2005-293537 A | 10/2005 |
| JP | 2003-187211 A | 7/2003 | | JP | 2005-295135 A | 10/2005 |
| JP | 2003-188338 A | 7/2003 | | JP | 2005-311205 A | 11/2005 |
| JP | 2003-188620 A | 7/2003 | | JP | 2005-321305 A | 11/2005 |
| JP | 2003-198230 A | 7/2003 | | JP | 2005-322119 A | 11/2005 |
| JP | 2003-209421 A | 7/2003 | | JP | 2005-335755 A | 12/2005 |
| JP | 2003-216919 A | 7/2003 | | JP | 2005-340759 A | 12/2005 |
| JP | 2003-218624 A | 7/2003 | | JP | 2005-345802 A | 12/2005 |
| JP | 2003-233780 A | 8/2003 | | JP | 2005-346820 A | 12/2005 |
| JP | 2003-242471 A | 8/2003 | | JP | 2005-352858 A | 12/2005 |
| JP | 2003-243918 A | 8/2003 | | JP | 2006-13976 A | 1/2006 |
| JP | 2003-249813 A | 9/2003 | | JP | 2006-013976 A | 1/2006 |
| JP | 2003-529163 A | 9/2003 | | JP | 2006-025390 A | 1/2006 |
| JP | 2003-288560 A | 10/2003 | | JP | 2006-031766 A | 2/2006 |
| JP | 2003-309418 A | 10/2003 | | JP | 2006-033312 A | 2/2006 |
| JP | 2003-317060 A | 11/2003 | | JP | 2006-39902 A | 2/2006 |
| JP | 2003-331246 A | 11/2003 | | JP | 2006-039947 A | 2/2006 |
| JP | 2003-332820 A | 11/2003 | | JP | 2006-42059 A | 2/2006 |
| JP | 2003-536302 A | 12/2003 | | JP | 2006-42097 A | 2/2006 |
| JP | 2004-040597 A | 2/2004 | | JP | 2006-053833 A | 2/2006 |
| JP | 2004-505481 A | 2/2004 | | JP | 2006-67479 A | 3/2006 |
| JP | 2004-082775 A | 3/2004 | | JP | 2006-72706 A | 3/2006 |
| JP | 2004-88218 A | 3/2004 | | JP | 2006-074348 A | 3/2006 |
| JP | 2004-93693 A | 3/2004 | | JP | 2006-80367 A | 3/2006 |
| JP | 2004-096566 A | 3/2004 | | JP | 2006-92630 A | 4/2006 |
| JP | 2004-096618 A | 3/2004 | | JP | 2006-102953 A | 4/2006 |
| JP | 2004-126750 A | 4/2004 | | JP | 2006-107296 A | 4/2006 |
| JP | 2004-127230 A | 4/2004 | | JP | 2006-513594 A | 4/2006 |
| JP | 2004-140513 A | 5/2004 | | JP | 2006-148462 A | 6/2006 |
| JP | 2004-163134 A | 6/2004 | | JP | 2006-148518 A | 6/2006 |
| JP | 2004-213582 A | 7/2004 | | JP | 2006-151402 A | 6/2006 |
| JP | 2004-519916 A | 7/2004 | | JP | 2006-174151 A | 6/2006 |
| JP | 2004-234595 A | 8/2004 | | JP | 2006-195795 A | 7/2006 |

| | | | |
|---|---|---|---|
| JP | 2006-203187 A | 8/2006 | |
| JP | 2006-203852 A | 8/2006 | |
| JP | 2006-217000 A | 8/2006 | |
| JP | 2006-232292 A | 9/2006 | |
| JP | 2006-237674 A | 9/2006 | |
| JP | 2006-246372 A | 9/2006 | |
| JP | 2006-270212 A | 10/2006 | |
| JP | 2006-270681 A | 10/2006 | |
| JP | 2006-270766 A | 10/2006 | |
| JP | 2006-285911 A | 10/2006 | |
| JP | 2006-287659 A | 10/2006 | |
| JP | 2006-295879 A | 10/2006 | |
| JP | 2006-302219 A | 11/2006 | |
| JP | 2006-309401 A | 11/2006 | |
| JP | 2006-311239 A | 11/2006 | |
| JP | 2006-323481 A | 11/2006 | |
| JP | 2006-339964 A | 12/2006 | |
| JP | 2007-007888 A | 1/2007 | |
| JP | 2007-13120 A | 1/2007 | |
| JP | 2007-18067 A | 1/2007 | |
| JP | 2007-019905 A | 1/2007 | |
| JP | 2007-28002 A | 2/2007 | |
| JP | 2007-040702 A | 2/2007 | |
| JP | 2007-043535 A | 2/2007 | |
| JP | 2007-048126 A | 2/2007 | |
| JP | 2007-65822 A | 3/2007 | |
| JP | 2007-79687 A | 3/2007 | |
| JP | 2007-81712 A | 3/2007 | |
| JP | 2007-096768 A | 4/2007 | |
| JP | 2007-102348 A | 4/2007 | |
| JP | 2007-116347 A | 5/2007 | |
| JP | 2007-122542 A | 5/2007 | |
| JP | 2007-150642 A | 6/2007 | |
| JP | 2007-150868 A | 6/2007 | |
| JP | 2007-159083 A | 6/2007 | |
| JP | 2007-159129 A | 6/2007 | |
| JP | 2007-166133 A | 6/2007 | |
| JP | 2007-172369 A | 7/2007 | |
| JP | 2007-172527 A | 7/2007 | |
| JP | 2007-228325 A | 9/2007 | |
| JP | 2007-233597 A | 9/2007 | |
| JP | 2007-266999 A | 10/2007 | |
| JP | 2007-272264 A | 10/2007 | |
| JP | 2007-287128 A | 11/2007 | |
| JP | 2007-295557 A | 11/2007 | |
| JP | 2007-312350 A | 11/2007 | |
| JP | 2007-324865 A | 12/2007 | |
| JP | 2008-033716 A | 2/2008 | |
| JP | 2008-042910 A | 2/2008 | |
| JP | 2008-72243 A | 3/2008 | |
| JP | 2008-083867 A | 4/2008 | |
| JP | 2008-097426 A | 4/2008 | |
| JP | 4069958 B2 | 4/2008 | |
| JP | 2008-103691 A | 5/2008 | |
| JP | 2008-107947 A | 5/2008 | |
| JP | 2008-513888 A | 5/2008 | |
| JP | 2008-148345 A | 6/2008 | |
| JP | 2008-519347 A | 6/2008 | |
| JP | 2008-160874 A | 7/2008 | |
| JP | 2008-167190 A | 7/2008 | |
| JP | 2008-197714 A | 8/2008 | |
| JP | 2008-535372 A | 8/2008 | |
| JP | 2008-207875 A | 9/2008 | |
| JP | 2008-217406 A | 9/2008 | |
| JP | 2008-288915 A | 11/2008 | |
| JP | 2009-017284 A | 1/2009 | |
| JP | 2009-25870 A | 2/2009 | |
| JP | 2009-27291 A | 2/2009 | |
| JP | 2009-044715 A | 2/2009 | |
| JP | 3148168 U | 2/2009 | |
| JP | 2009-110144 A | 5/2009 | |
| JP | 2009-153166 A | 7/2009 | |
| JP | 2009-182630 A | 8/2009 | |
| JP | 2010-009196 A | 1/2010 | |
| JP | 2010-050844 A | 3/2010 | |
| JP | 2010-081571 | 4/2010 | |
| JP | 4609604 B2 | 1/2011 | |
| NL | 9100176 A | 3/1992 | |
| NL | 9100347 A | 3/1992 | |
| WO | 98/33142 A1 | 7/1998 | |
| WO | 99/67754 A1 | 12/1999 | |
| WO | 00/10122 A2 | 2/2000 | |
| WO | 01/95242 A2 | 12/2001 | |
| WO | 02/48980 A1 | 6/2002 | |
| WO | 02/061675 A1 | 8/2002 | |
| WO | 02/097723 A1 | 12/2002 | |
| WO | 03/079305 A1 | 9/2003 | |
| WO | 2004/036772 A2 | 4/2004 | |
| WO | 2004/070879 A | 8/2004 | |
| WO | 2004/072892 A2 | 8/2004 | |
| WO | 2005/073937 A | 8/2005 | |
| WO | 2005/091434 A1 | 9/2005 | |
| WO | 2005/115849 A1 | 12/2005 | |
| WO | 2006/045682 A | 5/2006 | |
| WO | 2006/048663 A1 | 5/2006 | |
| WO | 2006/114821 A1 | 11/2006 | |
| WO | 2007/083574 A1 | 7/2007 | |
| WO | 2007/083575 A1 | 7/2007 | |
| WO | 2007/086130 A1 | 8/2007 | |
| WO | 2007/094494 A1 | 8/2007 | |
| WO | 2007/097385 A1 | 8/2007 | |
| WO | 2007/102360 A1 | 9/2007 | |
| WO | 2007/105348 A1 | 9/2007 | |
| WO | 2007/119310 A1 | 10/2007 | |
| WO | 2007/125683 A1 | 11/2007 | |
| WO | 2007/138857 A1 | 12/2007 | |
| WO | 2008/007606 A | 1/2008 | |
| WO | 2008/081699 A1 | 7/2008 | |
| WO | 2008/126458 A1 | 10/2008 | |
| WO | 2008/133018 A1 | 11/2008 | |
| WO | 2008/140037 A1 | 11/2008 | |
| WO | 2008/142957 A1 | 11/2008 | |
| WO | 2009/008296 A1 | 1/2009 | |
| WO | 2009/011144 A1 | 1/2009 | |
| WO | 2009/011376 A1 | 1/2009 | |
| WO | 2009/011400 A1 | 1/2009 | |
| WO | 2009/011423 A1 | 1/2009 | |
| WO | 2009/081719 A1 | 7/2009 | |
| WO | 2009/110381 A1 | 9/2009 | |
| WO | 2009/128437 A1 | 10/2009 | |
| WO | 2010/026939 A1 | 3/2010 | |

OTHER PUBLICATIONS

Official communication issued in counterpart Japanese Application No. 2008-103741, mailed on May 26, 2009.

Official communication issued in counterpart Japanese Application No. 2008-103742, mailed on May 26, 2009.

Official communication issued in International Application No. PCT/JP2008/050358, mailed on Mar. 25, 2008.

Official communication issued in International Application No. PCT/JP2008/050356, mailed on Mar. 25, 2008.

Osamura et al.: "Packaging Material With Electromagnetic Coupling Module," U.S. Appl. No. 12/536,663, filed Aug. 6, 2009.

Osamura et al.: "Packaging Material With Electromagnetic Coupling Module," U.S. Appl. No. 12/536,669, filed Aug. 6, 2009.

Dokai et al.: "Wireless IC Device and Component for Wireless IC Device," U.S. Appl. No. 12/543,553, filed Aug. 19, 2009.

Shioya et al.: "Wireless IC Device," U.S. Appl. No. 12/551,037, filed Aug. 31, 2009.

Ikemoto: "Wireless IC Device and Manufacturing Method Thereof," U.S. Appl. No. 12/579,672, filed Oct. 15, 2009.

Official communication issued in International Application No. PCT/JP2008/058614, mailed on Jun. 10, 2008.

Official Communication issued in International Patent Application No. PCT/JP2008/063025, mailed on Aug. 12, 2008.

Kato et al.: "Wireless IC Device," U.S. Appl. No. 12/603,608, filed Oct. 22, 2009.

Kato et al.: "Wireless IC Device," U.S. Appl. No. 12/688,072, filed Jan. 15, 2010.

Official Communication issued in International Patent Application No. PCT/JP2009/053693, mailed on Jun. 9, 2009.

Kato: "Composite Antenna," U.S. Appl. No. 12/845,846, filed Jul. 29, 2010.

Official Communication issued in International Patent Application No. PCT/JP2009/053690, mailed on Jun. 2, 2009.

Kato et al.: "Radio Frequency IC Device and Radio Communication System," U.S. Appl. No. 12/859,340, filed Aug. 19, 2010.
Official Communication issued in International Patent Application No. PCT/JP2009/055758, mailed on Jun. 23, 2009.
Kato et al.: "Wireless IC Device," U.S. Appl. No. 12/859,880, filed Aug. 20, 2010.
Official Communication issued in International Patent Application No. PCT/JP2009/057482, mailed on Jul. 21, 2009.
Kataya et al.: "Wireless IC Device, Electronic Apparatus, and Method for Adjusting Resonant Frequency of Wireless IC Device," U.S. Appl. No. 12/861,945, filed Aug. 24, 2010.
Kato: "Wireless IC Device and Electromagnetic Coupling Module," U.S. Appl. No. 12/890,895, filed Sep. 27, 2010.
Official Communication issued in International Patent Application No. PCT/JP2009/059410, mailed on Aug. 4, 2009.
Kato et al.: "Wireless IC Device" U.S. Appl. No. 12/902,174, filed Oct. 12, 2010.
Official Communication issued in International Patent Application No. PCT/JP2009/059259, mailed on Aug. 11, 2009.
Official Communication issued in corresponding Japanese Patent Application No. 2010-506742, mailed on Apr. 6, 2010.
Official Communication issued in International Patent Application No. PCT/JP2009/056698, mailed on Jul. 7, 2009.
English translation of NL9100176, published on Mar. 2, 1992.
English translation of NL9100347, published on Mar. 2, 1992.
Kato et al.: "Antenna"; U.S. Appl. No. 11/928,502, filed Oct. 30, 2007.
Kato et al.: "Wireless IC Device"; U.S. Appl. No. 12/211,117, filed Sep. 16, 2008.
Kato et al.: "Antenna"; U.S. Appl. No. 11/688,290, filed Mar. 20, 2007.
Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Device and Component for Wireless IC Device"; U.S. Appl. No. 12/339,198, filed Dec. 19, 2008.
Ikemoto et al.: "Wireless IC Device" U.S. Appl. No. 11/851,651, filed Sep. 7, 2007.
Kataya et al.: "Wireless IC Device and Electronic Device"; U.S. Appl. No. 11/851,661, filed Sep. 7, 2007.
Dokai et al.: "Antenna and Radio IC Device"; U.S. Appl. No. 12/350,307, filed Jan. 8, 2009.
Official Communication issued in International Patent Application No. PCT/JP2009/056934, mailed on Jun. 30, 2009.
Kato et al.: "Wireless IC Device"; U.S. Appl. No. 12/903,242, filed Oct. 13, 2010.
Kato et al.: "Wireless IC Device"; U.S. Appl. No. 12/940,103, filed Nov. 5, 2010.
Kato et al.: "Wireless IC Device System and Method of Determining Authenticity of Wireless IC Device"; U.S. Appl. No. 12/940,105, filed Nov. 5, 2010.
Official Communication issued in International Patent Application No. PCT/JP2009/059669, mailed on Aug. 25, 2009.
Official Communication issued in International Patent Application No. PCT/JP2009/062181, mailed on Oct. 13, 2009.
Official Communication issued in corresponding Japanese Application No. 2010-501323, mailed on Apr. 6, 2010.
Kato et al.: "Component of Wireless IC Device and Wireless IC Device"; U.S. Appl. No. 12/944,099, filed Nov. 11, 2010.
Kato et al.: Wireless IC Device and Manufacturing Method Thereof; U.S. Appl. No. 12/961,599, filed Dec. 7, 2010.
Kataya et al.: "Radio Frequency IC Device and Electronic Apparatus"; U.S. Appl. No. 12/959,454, filed Dec. 3, 2010.
Ikemoto et al.:"Radio IC Device"; U.S. Appl. No. 12/981,582, filed Dec. 30, 2010.
Official Communication issued in International Patent Application No. PCT/JP2009/062801, mailed on Oct. 27, 2009.
Ikemoto et al.: "Wireless IC Device and Electronic Apparatus"; U.S. Appl. No. 13/022,695, filed Feb. 8, 2011.
Official Communication issued in International Patent Application No. PCT/JP2009/067778, mailed on Jan. 26, 2010.
Kato: "Wireless IC Device and Method for Manufacturing Same"; U.S. Appl. No. 13/022,693, filed Feb. 8, 2011.
Kato: "Wireless IC Device"; U.S. Appl. No. 13/080,781, filed Apr. 6, 2011.
Official Communication issued in International Patent Application No. PCT/JP2009/069486, mailed on Mar. 2, 2010.
Kato: "Radio IC Device"; U.S. Appl. No. 13/080,775, filed Apr. 6, 2011.
Kato et al.: "Antenna and Wireless IC Device"; U.S. Appl. No. 13/083,626, filed Apr. 11, 2011.
Official Communication issued in International Patent Application No. PCT/JP2009/070617, mailed on Mar. 16, 2010.
Nagai, "Mounting Technique of RFID by Roll-To-Roll Process", Material Stage, Technical Information Institute Co., Ltd, vol. 7, No. 9, 2007, pp. 4-12.
Dokai et al.: "Wireless IC Device"; U.S. Appl. No. 13/088,480, filed Apr. 18, 2011.
Kato et al.: "High-Frequency Device and Wireless IC Device"; U.S. Appl. No. 13/094,928, filed Apr. 27, 2011.
Dokai et al.: "Wireless IC Device"; U.S. Appl. No. 13/099,392, filed May 3, 2011.
Kato et al.: "Radio Frequency IC Device"; U.S. Appl. No. 13/163,803, filed Jun. 20, 2011.
Official Communication issued in International Patent Application No. PCT/JP2010/050170, mailed on Apr. 13, 2010.
Official Communication issued in International Patent Application No. PCT/JP2010/051205, mailed on May 11, 2010.
Kato: "Wireless IC Device, Wireless IC Module and Method of Manufacturing Wireless IC Module"; U.S. Appl. No. 13/169,067, filed Jun. 27, 2011.
Kato et al.: "Antenna and Wireless IC Device"; U.S. Appl. No. 13/190,670, filed Jul. 26, 2011.
Shiroki et al.: "RFIC Chip Mounting Structure"; U.S. Appl. No. 13/223,429, filed Sep. 1, 2011.
Official Communication issued in International Patent Application No. PCT/JP2010/056559, mailed on Jul. 27, 2010.
Taniguchi et al.: "Antenna Device and Radio Frequency IC Device"; U.S. Appl. No. 13/232,102, filed Sep. 14, 2011.
Official Communication issued in International Patent Application No. PCT/JP2009/066336, mailed on Dec. 22, 2009.
Official Communication issued in corresponding Japanese Patent Application No. 2010-509439, mailed on Jul. 6, 2010.
Official Communication issued in corresponding Japanese Patent Application No. 2011-032311, mailed on Mar. 29, 2011
Official Communication issued in corresponding Japanese Patent Application No. 2009-525327, drafted on Sep. 22, 2010.
Official Communication issued in corresponding Japanese Patent Application No. 2011-032311, mailed on Aug. 2, 2011.
Official Communication issued in corresponding Japanese Patent Application No. 2011-032312, mailed on Aug. 2, 2011.
Official Communication issued in corresponding Japanese Patent Application No. 2011-032311, mailed on Aug. 23, 2011.
Kato et al.: "Wireless IC Device Component and Wireless IC Device"; U.S. Appl. No. 13/241,823, filed Sep. 23, 2011.
Kato et al.: "Antenna Device and Method of Setting Resonant Frequency of Antenna Device"; U.S. Appl. No. 13/272,365, filed Oct. 13, 2011.

Official Communication issued in International Patent Application No. PCT/JP2010/056812, mailed on Jul. 13, 2010.
Dokai et al.: "Optical Disc"; U.S. Appl. No. 13/295,153, filed Nov. 14, 2011.
Official Communication issued in International Patent Application No. PCT/JP2010/057668, mailed on Aug. 17, 2010.
Osamura et al.: "Radio Frequency IC Device and Method of Manufacturing the Same"; U.S. Appl. No. 13/308,575, filed Dec. 1, 2011.
Official Communication issued in International Patent Application No. PCT/JP2010/069417, mailed on Dec. 7, 2010.
Kato: "Wireless IC Device and Coupling Method for Power Feeding Circuit and Radiation Plate"; U.S. Appl. No. 13/325,273, filed Dec. 14, 2011.
Official Communication issued in International Patent Application No. PCT/JP2010/053496, mailed on Jun. 1, 2010.
Ikemoto: "Wireless IC Tag, Reader-Writer, and Information Processing System"; U.S. Appl. No. 13/329,354, filed Dec. 19, 2011.
Kato et al.: "Antenna and Antenna Module"; U.S. Appl. No. 13/334,462, filed Dec. 22, 2011.
Official Communication issued in International Patent Application No. PCT/JP2010/069418, mailed on Feb. 8, 2011.
Official Communication issued in International Patent Application No. PCT/JP2010/063082, mailed on Nov. 16, 2010.
Ikemoto: "Communication Terminal and Information Processing System"; U.S. Appl. No. 13/412,772, filed Mar. 6, 2012.
"Antenna Engineering Handbook", The Institute of Electronics and Communication Engineers, Mar. 5, 1999, pp. 20-21.
Official Communication issued in International Patent Application No. PCT/JP2010/066714, mailed on Dec. 14, 2010.
Nomura et al.: "Antenna and Wireless IC Device"; U.S. Appl. No. 13/419,454, filed Mar. 14, 2012.
Official Communication issued in International Patent Application No. PCT/JP2010/070607, mailed on Feb. 15, 2011.
Ito: "Wireless IC Device and Method of Detecting Environmental State Using the Device"; U.S. Appl. No. 13/421,889, filed Mar. 16, 2012.
Official Communication issued in International Patent Application No. PCT/JP2011/053654, mailed on Mar. 29, 2011.
Kato et al.: "Antenna Device and Mobile Communication Terminal"; U.S. Appl. No. 13/425,505, filed Mar. 21, 2012.
Official Communication issued in International Patent Application No. PCT/JP2010/069416, mailed on Feb. 8, 2011.
Kato et al.: "Wireless Communication Device and Metal Article"; U.S. Appl. No. 13/429,465, filed Mar. 26, 2012.
Official Communication issued in International Patent Application No. PCT/JP2011/055344, mailed on Jun. 14, 2011.
Kubo et al.: "Antenna and Mobile Terminal"; U.S. Appl. No. 13/452,972, filed Apr. 23, 2012.
Ikemoto: "RFID System"; U.S. Appl. No. 13/457,525, filed Apr. 27, 2012.
Ikemoto et al.: "Wireless IC Device and Electronic Apparatus"; U.S. Appl. No. 13/468,058, filed May 10, 2012.
Official Communication issued in corresponding Japanese Patent Application No. 2009-238219, mailed on Jun. 12, 2012.
Official communication issued in Japanese Application No. 2007-531524, mailed on Sep. 11, 2007.
Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags")", RFID, pp. 112-126.
Dokai et al.: "Wireless IC Device and Component for Wireless IC Device"; U.S. Appl. No. 11/624,382, filed Jan. 18, 2007.
Dokai et al.: "Wireless IC Device, and Component for Wireless IC Device"; U.S. Appl. No. 11/930,818, filed Oct. 31, 2007.
Kato et al.: "Wireless IC Device"; U.S. Appl. No. 12/042,399, filed Mar. 5, 2008.
Official communication issued in related U.S. Appl. No. 12/042,399; mailed on Aug. 25, 2008.
Official Communication issued in International Application No. PCT/JP2007/066007, mailed on Nov. 27, 2007.
Dokai et al.: "Wireless IC Device and Component for Wireless IC Device"; U.S. Appl. No. 12/359,690, filed Jan. 26, 2009.
Dokai et al.: "Test System for Radio Frequency IC Devices and Method of Manufacturing Radio Frequency IC Devices Using the Same"; U.S. Appl. No. 12/388,826, filed Feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; U.S. Appl. No. 12/390,556, filed Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, mailed on May 1, 2008.
Kato et al.: "Article Having Electromagnetic Coupling Module Attached Thereto"; U.S. Appl. No. 12/401,767, filed Mar. 11, 2009.
Taniguchi et al.: "Antenna Device and Radio Frequency IC Device"; U.S. Appl. No. 12/326,117, filed Dec. 2, 2008.
Official Communication issued in International Patent Application No. PCT/JP2008/061442, mailed on Jul. 22, 2008.
Kato et al.: "Container With Electromagnetic Coupling Module"; U.S. Appl. No. 12/426,369, filed Apr. 20, 2009.
Kato: "Wireless IC Device"; U.S. Appl. No. 12/429,346, filed Apr. 24, 2009.
Official communication issued in counterpart International Application No. PCT/JP2008/071502, mailed Feb. 24, 2009.
Kato et al.: "Wireless IC Device and Manufacturing Method Thereof," U.S. Appl. No. 12/432,854, filed Apr. 30, 2009.
Official communication issued in counterpart International Application No. PCT/JP2008/058168, mailed Aug. 12, 2008.
Official communication issued in counterpart International Application No. PCT/JP2008/062886, mailed Oct. 21, 2008.
Kato et al.: "Wireless IC Device," U.S. Appl. No. 12/469,896, filed May 21, 2009.
Ikemoto et al.: "Wireless IC Device," U.S. Appl. No. 12/496,709, filed Jul. 2, 2009.
Official communication issued in counterpart International Application No. PCT/JP2008/062947, mailed Aug. 19, 2008.
Official communication issued in counterpart International Application No. PCT/JP2008/056026, mailed Jul. 1, 2008.
Ikemoto et al.: "Wireless IC Device and Electronic Apparatus," U.S. Appl. No. 12/503,188, filed Jul. 15, 2009.
Official communication issued in counterpart International Application No. PCT/JP2008/055567, mailed May 20, 2008.
Official communication issued in counterpart International Application No. PCT/JP2008/051853, mailed Apr. 22, 2008.
Official communication issued in counterpart International Application No. PCT/JP2008/057239, mailed Jul. 22, 2008.
Kimura et al.: "Wireless IC Device," U.S. Appl. No. 12/510,338, filed Jul. 28, 2009.
Kato et al.: "Wireless IC Device," U.S. Appl. No. 12/510,340, filed Jul. 28, 2009.
Kato: "Wireless IC Device," U.S. Appl. No. 12/510,344, filed Jul. 28, 2009.
Kato et al.: "Wireless IC Device," U.S. Appl. No. 12/510,347, filed Jul. 28, 2009.

* cited by examiner

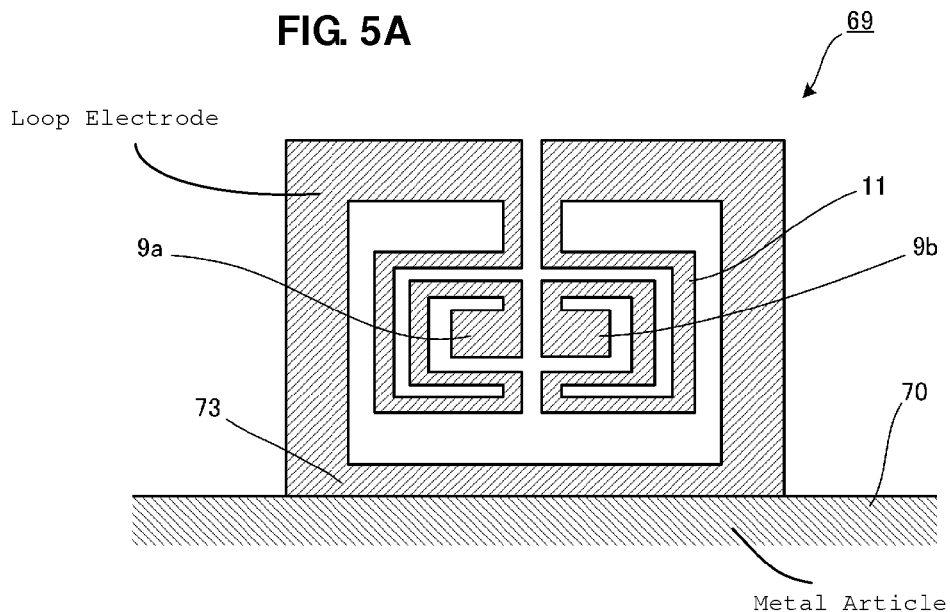
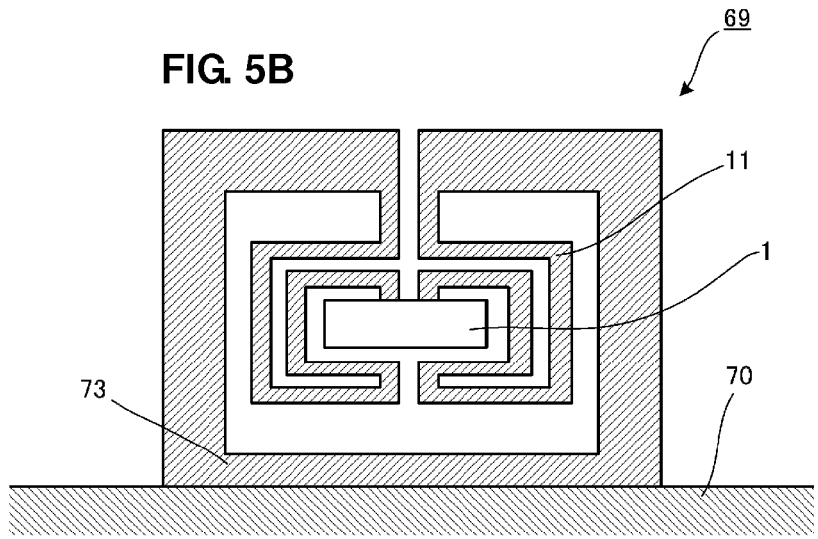

WIRELESS IC DEVICE

BACKGROUND OF THE INVENTION

1. Field of the Invention

The present invention relates to a wireless IC device for a radio frequency identification (RFID) system which enables non-contact data communication via electromagnetic waves.

2. Description of the Related Art

Recently, RFID systems have been used as article management systems. For information transmission, an RFID system enables non-contact communication between a reader/writer that generates an induction field and a wireless IC device that is attached to an article and stores predetermined information.

FIG. 1 is an external perspective view illustrating an example of a metal article to which an IC tag label described in Japanese Unexamined Patent Application Publication No. 2003-6599 is attached.

An IC tag label 102 has a rectangular thin film shape. The IC tag 102 has an IC chip 102a at the center thereof and a thin-film antenna 102b in an outer region thereof. To accommodate the IC tag 102 in a floating state in a recessed portion 105a in a head 101a of a metal article 101, the IC tag 102 is secured to the bottom surface of a non-metallic plate 103. The non-metallic plate 103 is disposed in the recessed portion 105a and secured therein. The head 101a has a notch 106.

With the configuration described above, a magnetic field generated by the antenna 102b in the IC tag 102 can be formed into a loop that passes through the notch 106, the exterior of the metal article 101, and the non-metallic plate 103 and returns to the antenna 102b.

A metal article with an IC tag is thus produced.

However, the IC tag and the metal article provided with the IC tag described in Japanese Unexamined Patent Application Publication No. 2003-6599 have the following problems.

(1) Forming a complex structure including the recessed portion and the notch involves a long process and the use of additional components. This leads to an increase in the cost of manufacturing the metal article.

(2) Producing the non-metallic plate to cover the recessed portion involves the preparation of a material that is different from that of the metal article, a long process, and the use of additional material. This leads to an increase in the cost of manufacturing a metal structure. Additionally, application distortion occurs at a portion in which the non-metallic plate is secured to the metal article, due to a difference in thermal expansion coefficients. This may cause cracks or fractures.

(3) Forming an antenna pattern is required to enable the IC tag to operate.

SUMMARY OF THE INVENTION

To overcome the problems described above, preferred embodiments of the present invention reduce the cost of manufacturing a metal article, and provide a wireless IC device using the metal article as a radiator.

A wireless IC device according to a preferred embodiment of the present invention includes a high-frequency device defined by an electromagnetically coupled module or a wireless IC chip, the electromagnetically coupled module including the wireless IC chip and a feed circuit board coupled to an external circuit and electrically connected to or electromagnetically coupled to the wireless IC chip, a radiation electrode defining a radiator, and a loop electrode coupled to the high-frequency device and the radiation electrode, and having a loop plane perpendicular or inclined relative to a plane of the radiation electrode.

The loop electrode may preferably be electromagnetically coupled to the radiation electrode with an insulating layer interposed therebetween.

Alternatively, the loop electrode may preferably be directly electrically connected to the radiation electrode, and a portion of the radiation electrode may also function as a portion of the loop electrode.

The wireless IC device may preferably further include a matching circuit between a mounting area of the high-frequency device and the loop electrode, the matching circuit being configured to directly electrically connect the high-frequency device to the loop electrode.

The wireless IC device may preferably further include at least one of a resonant circuit and a matching circuit in the feed circuit board.

A resonance frequency of the resonant circuit may preferably be substantially equal to a frequency of a signal transmitted and received by the radiation electrode.

The high-frequency device or the loop electrode may preferably be covered with plastic.

The high-frequency device and the loop electrode may preferably be molded of plastic on the radiation electrode.

The radiation electrode may preferably be a cylindrical metal article having a conductive layer.

The radiation electrode may preferably be an electrode pattern provided on a circuit board inside electronic equipment.

The radiation electrode may preferably be a metal plate provided in a component inside electronic equipment.

The loop electrode may preferably be disposed on a surface opposite to an electromagnetic wave transmission/reception surface outside the radiation electrode.

The loop electrode may preferably be covered with the radiation electrode or a conductive surface including the radiation electrode.

Processing steps and components required to form, in a metal article, a notch, a recessed portion, and a plate, for example, such as those illustrated in FIG. 1, are not required for the wireless IC device according to preferred embodiments of the present invention. Thus, there is substantially no cost increase associated with the addition of the wireless IC device to the article.

Since all or a portion of the metal article can be used as a radiator, it is possible to improve radiation characteristics.

The use of the electromagnetically coupled module enables the design of impedance matching between the wireless IC chip and the radiation electrode within the feed circuit board. This increases the degree of design freedom.

The amount of coupling between the radiation electrode and the loop electrode according to a preferred embodiment of the present invention is greatest when the loop electrode is perpendicular or substantially perpendicular to the radiation electrode. However, even if the loop plane of the loop electrode is inclined to the plane of the radiation electrode, the radiation electrode and the loop electrode are coupled to each other, although the amount of coupling therebetween is reduced. Thus, a high degree of flexibility when arranging the loop electrode relative to the radiation electrode is provided.

When the loop electrode is coupled to the high-frequency device and electromagnetically coupled to the radiation electrode with an insulating layer interposed therebetween, matching between the high-frequency device and the loop electrode is easily achieved. Additionally, since the loop electrode and the radiation electrode are galvanically isolated from each other, high resistance to static electricity is achieved.

When the loop electrode is coupled to the high-frequency device and directly electrically connected to the radiation electrode, and a portion of the radiation electrode also functions as the loop electrode, matching between the high-frequency device and the loop electrode is easily achieved. Additionally, since the loop electrode is strongly coupled to the radiation electrode, high gain is provided.

When a matching circuit is provided between a mounting area for mounting the high-frequency device and the loop electrode, the matching circuit can be used as an inductor for impedance matching between the radiation electrode and the high-frequency device. Thus, flexible and easy design of the impedance matching in the wireless IC device is achieved.

Providing a resonant circuit in the feed circuit board improves frequency selectivity and allows an operating frequency of the wireless IC device to be substantially determined by the self-resonant frequency. Accordingly, transmission and reception of energy of signals having a frequency used in the RFID system can be performed with a high degree of efficiency. Thus, radiation characteristics of the wireless IC device can be improved.

In addition, by providing a matching circuit in the feed circuit board, transmission and reception of the energy of signals having a frequency used in the RFID system can be performed with a high degree of efficiency.

When a resonance frequency of the resonant circuit is set to be substantially equal to a frequency of a signal transmitted and received by the radiation electrode, transmission and reception of energy of signals having a frequency used in the RFID system can be performed with a high degree of efficiency. It is only necessary for the radiation electrode to simply be coupled to the feed circuit board and have a size appropriate for a required gain. The shape and material of the radiation electrode are not limited by the frequency used, and the radiation electrode can be used for any types of articles.

When the high-frequency device or the loop electrode is covered with plastic, the electromagnetically coupled module can be directly attached to a metal article. Thus, the degree of design freedom is increased.

When the high-frequency device and the loop electrode are molded out of plastic on the radiation electrode, the processing steps of covering the electromagnetically coupled module and bonding the electromagnetically coupled module to a metal article can be simultaneously performed. This makes it possible to reduce the number of processing steps and the manufacturing cost.

When a metal article having a substantially cylindrical shape and a conductive layer is used as the radiation electrode, the metal article can be used as it is and substantially the entire metal article acts as a radiator. Therefore, even if a plurality of articles are stacked on top of each other, an ID for each article can be read.

When an electrode pattern provided on a circuit board inside electronic equipment is used as the radiation electrode, the circuit board inside the electronic equipment can be used without modification, and mounting of the high-frequency device is facilitated.

When a metal plate provided in a component, such as a liquid crystal display panel, inside electronic equipment is used as the radiation electrode, the component inside the electronic equipment can be used without modification. Thus, an increase in the size and cost is prevented.

When the loop electrode is disposed on the surface opposite to the electromagnetic wave transmission/reception surface outside the radiation electrode, that is, on the side opposite to the surface on which the high-frequency device is provided, the wireless IC device can be disposed inside an article. Thus, the wireless IC device is protected by the radiation electrode and its durability is increased.

When the loop electrode is covered with the radiation electrode or a conductive surface including the radiation electrode, the durability and environmental resistance of the wireless IC device are improved.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 5A and 5B illustrate a configuration of a wireless IC device according to a second preferred embodiment of the present invention.

DETAILED DESCRIPTION OF PREFERRED EMBODIMENTS

First Preferred Embodiment

Figure 1:
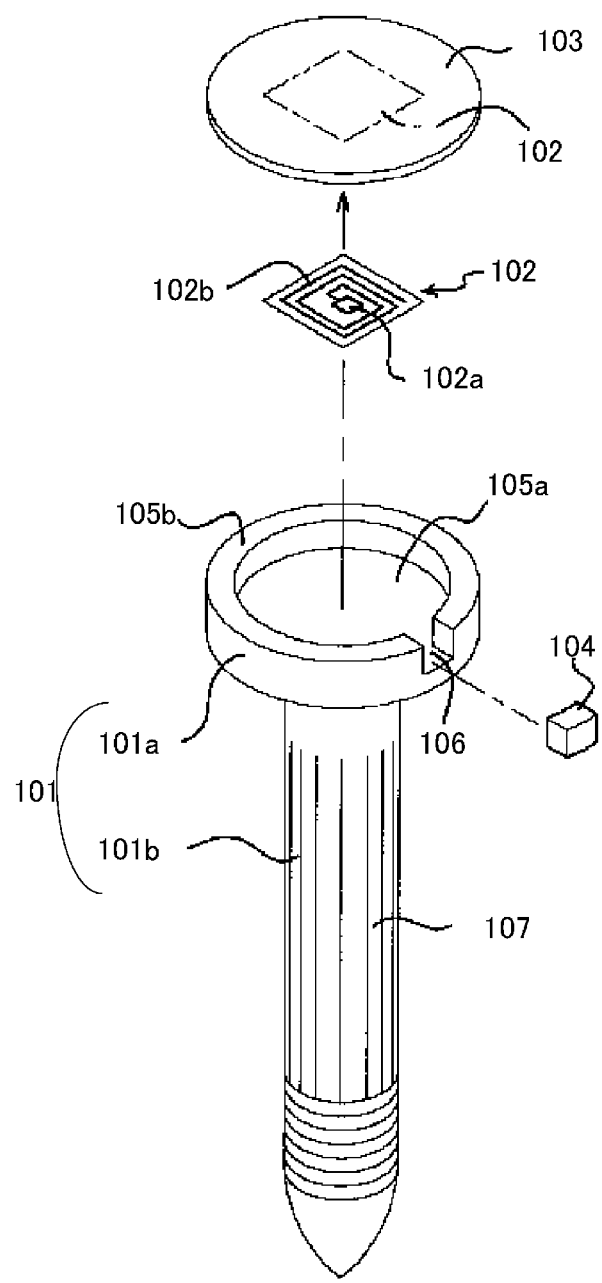
FIG. 1 illustrates a configuration of a wireless IC device of the related art.
Figure 2:
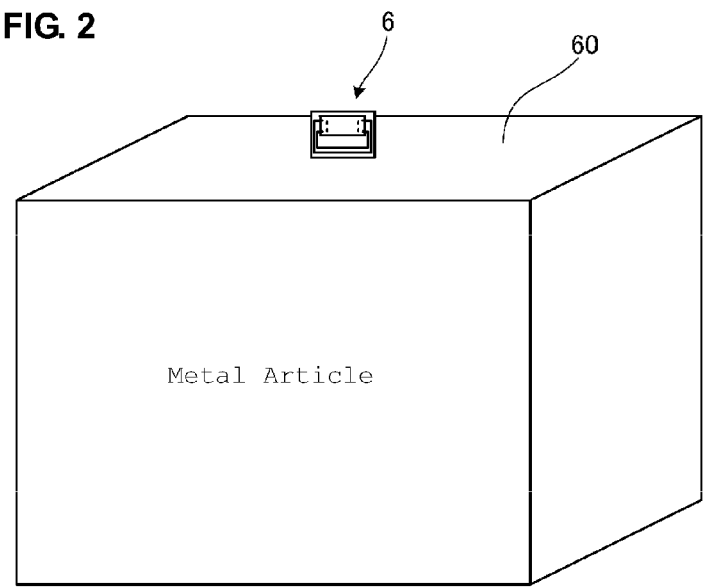
FIG. 2 illustrates a configuration of a wireless IC device according to a first preferred embodiment of the present invention and an article provided with the wireless IC device.

FIG. 2 is an external perspective view illustrating a wireless IC device according to a first preferred embodiment of the present invention and a metal article provided with the wireless IC device. A metal article 60 is defined as an article having at least a surface or near-surface layer that is made of metal.

A wireless-IC-device main component 6 is provided on a predetermined surface of the metal article 60. The component indicated by reference numeral 6 is not referred to as a wireless IC device. This is because the wireless IC device is defined not only by the component indicated by reference numeral 6, but also by a portion of the metal surface of the metal article 60.

Figure 3:
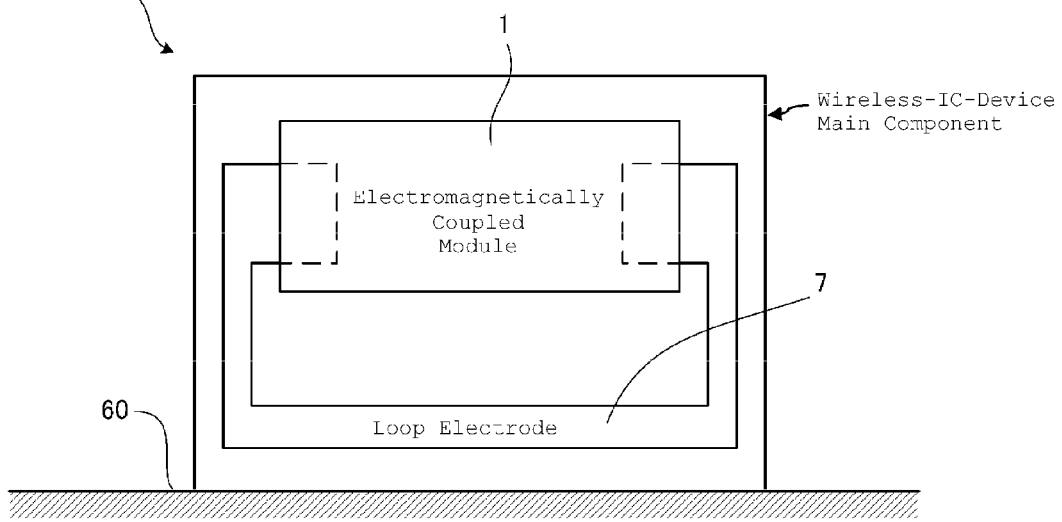
FIG. 3 is an enlarged view of a main component of the wireless IC device illustrated in FIG. 2.

FIG. 3 is an enlarged view of the wireless-IC-device main component. The wireless-IC-device main component 6 has an insulating substrate, which is provided with a loop electrode 7 and an electromagnetically coupled module 1 coupled to the loop electrode 7. The wireless-IC-device main component 6 is arranged such that a loop plane of the loop electrode 7 is substantially perpendicular to the metal article 60.

The wireless-IC-device main component 6 having the loop electrode 7 is bonded to the metal article 60 with an insulating adhesive.

Figure 4:
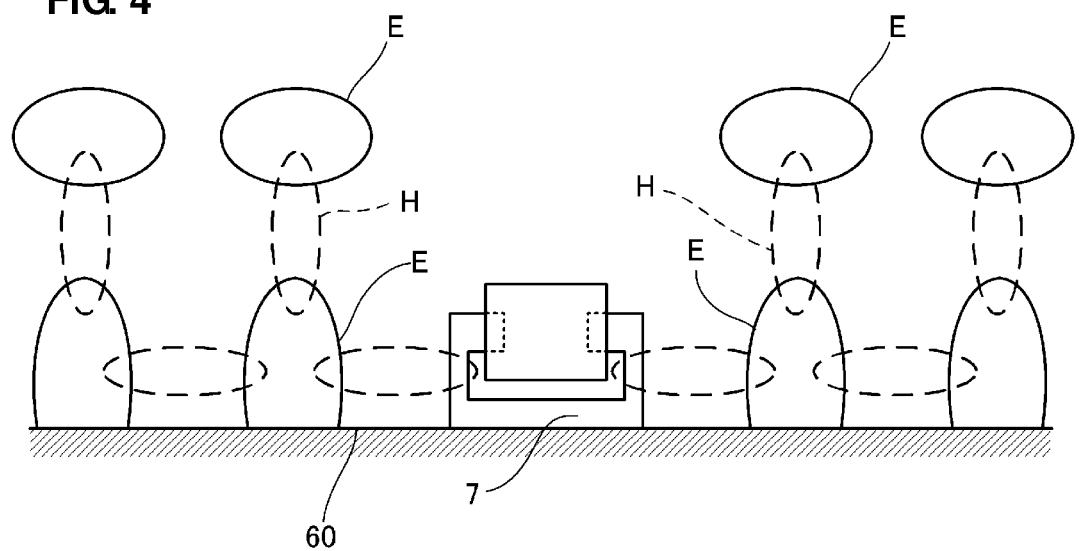
FIG. 4 is a schematic view illustrating a distribution of electromagnetic fields near the wireless IC device on the surface of the metal article illustrated in FIG. 2.

FIG. 4 schematically illustrates an example of a distribution of electromagnetic fields generated on the metal article 60 when the loop electrode 7 acts as an auxiliary radiator for transmission. In the drawing, dashed lines indicate loops of magnetic fields H, while solid lines indicate loops of electric fields E. The loop electrode 7 acts as an auxiliary radiator for magnetic fields, causes the magnetic fields H to be generated parallel to the surface of the metal article 60, and induces the electric fields E in a direction substantially perpendicular to the surface of the metal article 60. Then, electric field loops induce magnetic field loops and thus, this chain of induction events expands the distribution of electromagnetic fields.

In the example described above, the loop electrode 7 functions as an auxiliary transmission radiator. High gain is also obtained when the loop electrode 7 functions as an auxiliary reception radiator.

The electromagnetically coupled module 1 illustrated in FIG. 3 includes a wireless IC chip and a feed circuit board that are described below. The wireless IC chip and the feed circuit board may either be electrically connected to each other or electromagnetically coupled to each other. For electromagnetic coupling, a capacitance is preferably provided by a dielectric thin film between electrodes of the wireless IC chip and the feed circuit board. By enabling the wireless IC chip and the feed circuit board to be coupled through the capacitance, the wireless IC chip is protected from static damage.

When the feed circuit board is provided, the electrode of the feed circuit board is preferably electromagnetically coupled to both ends of the loop electrode 7. Alternatively, the electromagnetically coupled module 1 may preferably be replaced with a single wireless IC chip. In both cases, since the loop electrode 7 is galvanically isolated from the metal article 60, the wireless IC device is highly resistant to static electricity.

The loop electrode 7 may have any shape which enables coupling between input and output terminals of the electromagnetically coupled module 1.

Electric fields on a surface of a metal article are preferably perpendicular or substantially perpendicular to the surface of the metal article. Therefore, if the loop plane of the loop electrode 7 is inclined from the position perpendicular or substantially perpendicular to the surface of the metal article 60, the strength of electric fields induced by magnetic fields of the loop electrode 7 is reduced, and thus, the antenna gain is reduced. The gain increases as the loop plane of the loop electrode 7 approaches an orientation that is perpendicular to the metal article 60. However, even if the loop plane of the loop electrode 7 is inclined relative to the surface of the metal article 60, the metal article 60 still functions as a radiator. Therefore, the loop plane of the loop electrode 7 may be inclined if necessary.

To enable the loop electrode 7 to be arranged perpendicular or substantially perpendicularly to the metal article 60, a recessed portion arranged to accommodate an end of the feed circuit board may preferably be provided on the surface of the metal article 60. In this case, the recessed portion may be provided internally with an insulating material, such as an insulating adhesive.

In the first preferred embodiment, the loop electrode is preferably directly bonded to the surface of the metal article 60. Alternatively, for example, the loop electrode 7 may be bonded to a metal foil sheet or metal plate, which may then be bonded to the metal article 60.

Second Preferred Embodiment

FIGS. 5A and 5B illustrate configurations of two wireless IC devices according to a second preferred embodiment of the present invention. In the second preferred embodiment, a matching circuit is arranged between a mounting area of a high-frequency device and a loop electrode. The matching circuit enables the high-frequency device and the loop electrode to be directly electrically connected to each other.

Referring to FIG. 5A, a metal article 70 is an article having at least a surface or near-surface layer that is made of metal. A loop electrode 73 is arranged such that the loop plane thereof is perpendicular or substantially perpendicular to the metal article 70. This enables the metal article 70 to function as a radiator.

A wireless-IC-device main component 69 is provided internally with a matching circuit 11 including a meandering electrode, and metal ribbons 9a and 9b defining a mounting area arranged to mount a high-frequency device (electromagnetically coupled module or wireless IC chip).

By providing the matching circuit 11, the wireless IC chip can be directly mounted on the metal ribbons 9a and 9b. If the wireless IC chip is directly mounted on the loop electrode, the operating frequency of the wireless IC device is substantially determined by the loop electrode including the matching circuit 11.

FIG. 5B illustrates a state in which the electromagnetically coupled module 1 is mounted on the metal ribbons 9a and 9b in the wireless-IC-device main component 69 illustrated in FIG. 5A. The configuration of the matching circuit 11, the metal ribbons 9a and 9b defining a mounting area of the electromagnetically coupled module, and loop electrode 73 is substantially the same as that illustrated in FIG. 5A.

With this configuration, the loop electrode 73 functions as an auxiliary radiator for magnetic fields and is coupled to the metal article 70. Thus, the metal article 70 functions as a radiator.

The metal article 70 illustrated in FIGS. 5A and 5B may preferably be, for example, a solid electrode provided on a circuit board inside a mobile phone terminal.

Third Preferred Embodiment

Figure 6:
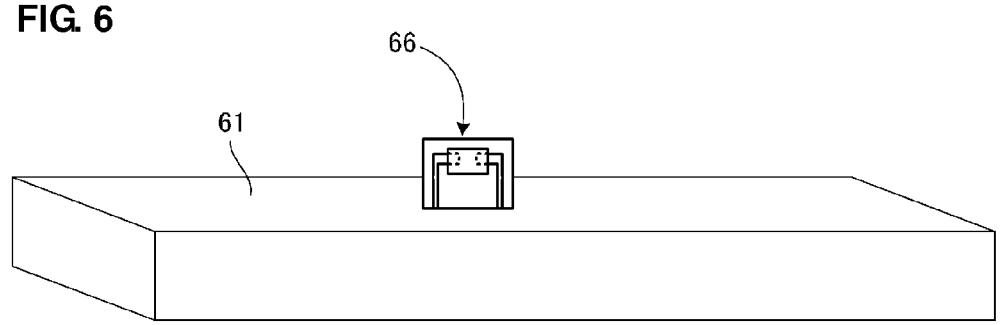
FIG. 6 illustrates a configuration of a wireless IC device according to a third preferred embodiment of the present invention and an article provided with the wireless IC device.

FIG. 6 is an external perspective view illustrating a wireless IC device according to a third preferred embodiment of the present invention and a metal article provided with the wireless IC device. A metal article 61 is an article having at least a surface or near-surface layer that is made of metal.

In the preferred embodiment illustrated in FIG. 3, the entire loop electrode is provided on the substrate of the wireless-IC-device main component 6. Loop electrode segments 71 that define a portion of the loop electrode are provided on a substrate of a wireless-IC-device main component 66. Then, a portion of the metal article 61 also functions as a portion of the loop electrode.

Figure 7:
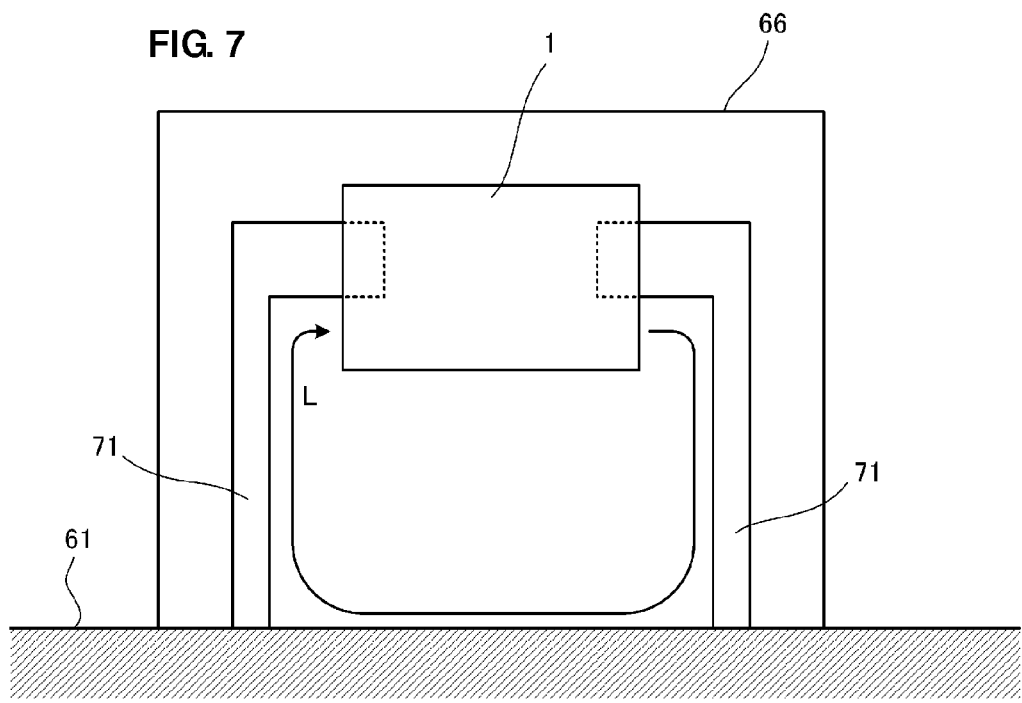
FIG. 7 is an enlarged view of a main component of the wireless IC device for the article illustrated in FIG. 6.

FIG. 7 is an enlarged view of the wireless-IC-device main component 66 illustrated in FIG. 6. The wireless-IC-device main component 66 includes a substrate provided with the loop electrode segments 71 and the electromagnetically coupled module 1 coupled to the loop electrode segments 71. The configuration of the electromagnetically coupled module 1 is substantially the same as that illustrated in FIG. 3. The loop electrode segments define a portion of the loop electrode. A portion of the surface of the metal article 61 also functions as a portion of the loop electrode. In other words, the loop electrode segments and the surface of the metal article 61 define the loop electrode, as indicated by L in the drawing.

With this configuration, the loop electrode defined by the loop electrode segments 71 and the surface of the metal article 61 functions as an auxiliary radiator for magnetic fields and is coupled to the metal article 61. Thus, the surface of the metal article 61 functions as a radiator.

Fourth Preferred Embodiment

Figure 8:
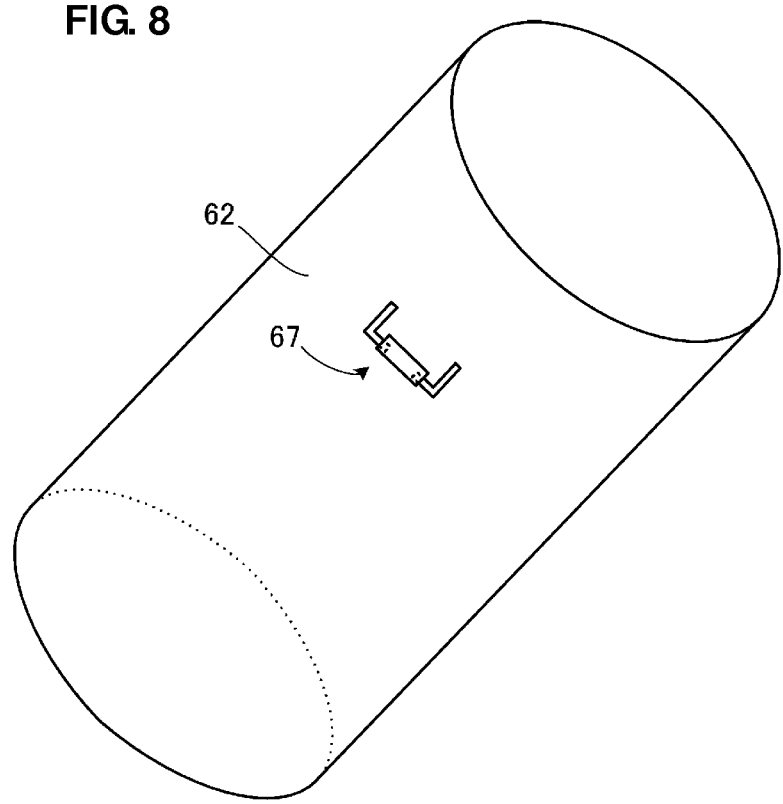
FIG. 8 illustrates a configuration of a wireless IC device according to a fourth preferred embodiment of the present invention and an article provided with the wireless IC device.

FIG. 8 is an external view of a metal article provided with a wireless IC device according to a fourth preferred embodiment of the present invention. A metal article 62 is, for example, a cylindrical or substantially cylindrical metal can. Unlike the polyhedral metal articles illustrated in FIG. 2 and FIG. 6, the metal article 62 illustrated in FIG. 8 has a cylindrical or substantially cylindrical shape. A wireless-IC-device main component 67 is attached to the periphery of the metal article 62.

Figure 9:
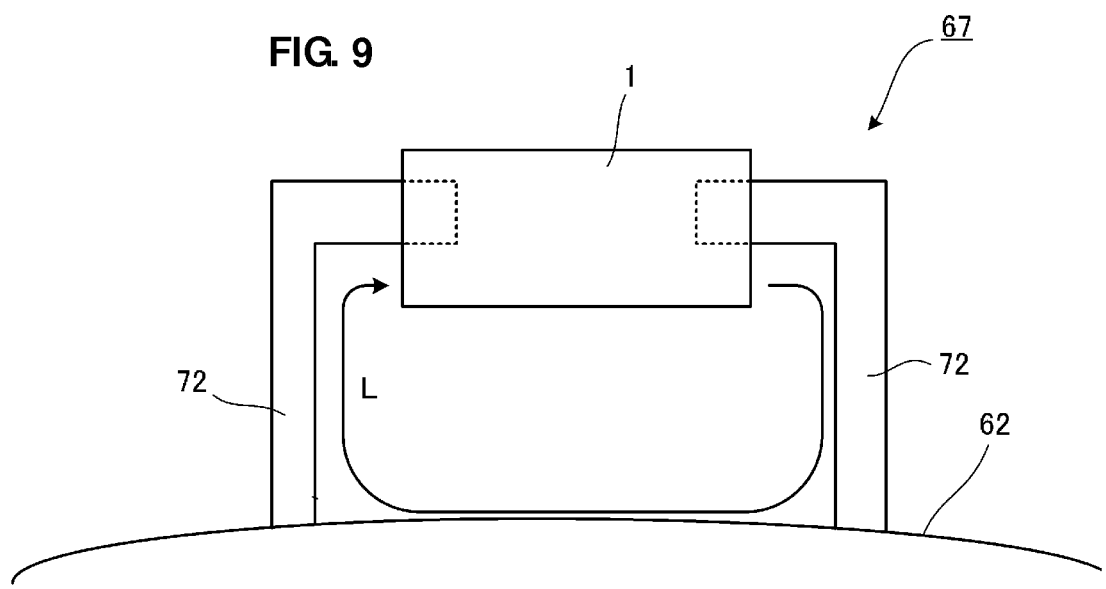
FIG. 9 is an enlarged view of a main component of the wireless IC device illustrated in FIG. 8.

FIG. 9 is an enlarged view of a mounting area of the wireless-IC-device main component 67 illustrated in FIG. 8. The wireless-IC-device main component 67 includes loop electrode segments 72 and the electromagnetically coupled module 1 coupled to the loop electrode segments 72. Unlike the loop electrode segments 71 provided on the substrate as illustrated in FIG. 7, the loop electrode segments 72 illustrated in FIG. 9 are preferably made of metal plates, for example. The configuration of the electromagnetically coupled module 1 is substantially the same as that illustrated in FIG. 3 and FIG. 7.

With this configuration, the loop electrode defined by the loop electrode segments 72 and the surface of the metal article 62 functions as an auxiliary radiator for magnetic fields and is coupled to the metal article 62. Thus, the surface of the metal article 62 functions as a radiator.

When many articles are stacked, the above-described chain of induction events that occurs between electric and magnetic fields also occur among the articles, as long as a conductive portion of each of the article functions as a radiator. Therefore, if many articles are stacked, the wireless IC device functions as a high-gain wireless IC device. For example, when an antenna of a reader/writer is disposed close to a stack of soft drink cans to which a preferred embodiment of the present invention is applied, IDs for all of the soft drink cans in the stack can be read.

Even with a paper container, if it includes a conductive layer of aluminum or other suitable metal, the conductive layer functions as a radiator.

Fifth Preferred Embodiment

Figure 10:
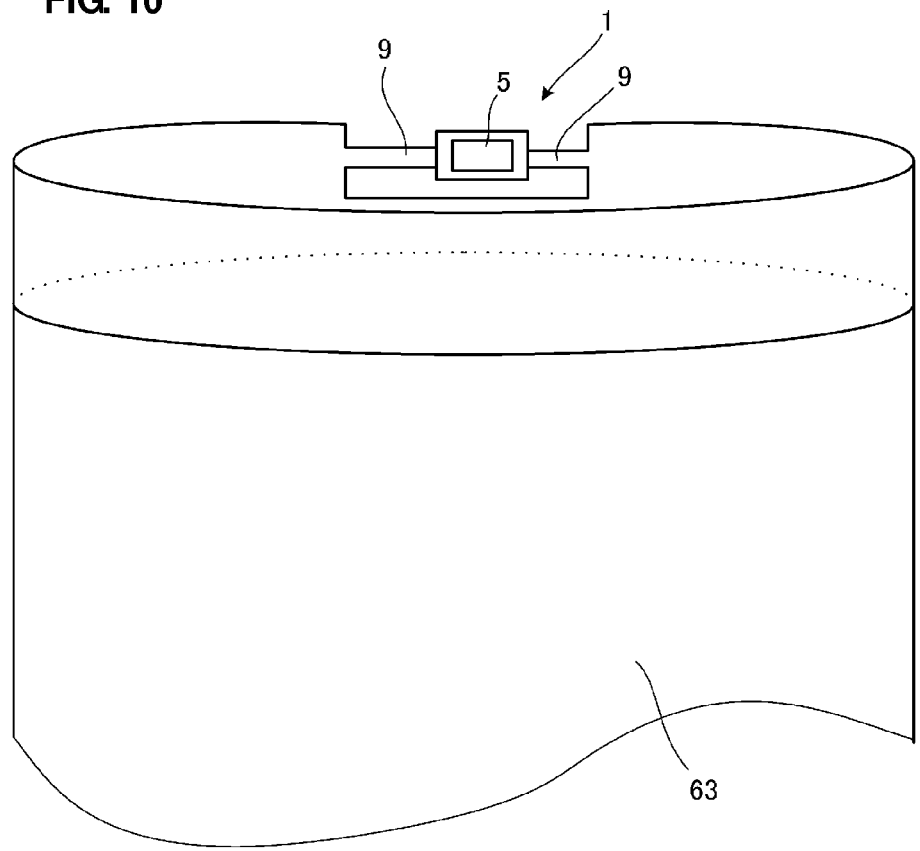
FIG. 10 illustrates a configuration of a wireless IC device according to a fifth preferred embodiment of the present invention and an article provided with the wireless IC device.

FIG. 10 is an external view of a metal article provided with a wireless IC device according to a fifth preferred embodiment of the present invention. A metal article is, for example, a cylindrical metal can. In the example illustrated in FIG. 8, the electromagnetically coupled module 1 is arranged on the periphery of the metal article 62. In the example illustrated in FIG. 10, metal ribbons 9 are provided in a portion of the metal article 63, and the electromagnetically coupled module 1 is arranged on the metal ribbons 9. The electromagnetically coupled module 1 and the metal ribbons 9 may be covered with an insulating material, such as plastic, or an insulating material may be molded around the electromagnetically coupled module 1 and the metal ribbons 9.

Figure 11:
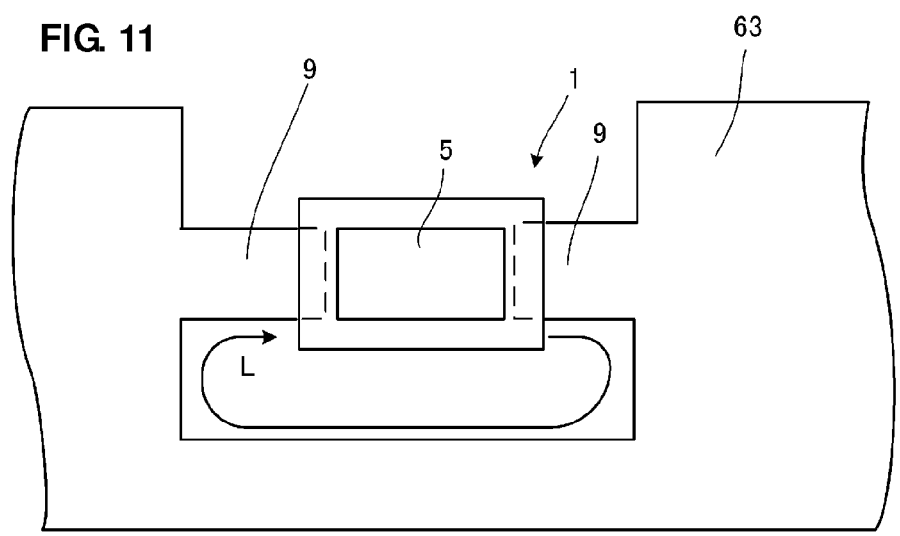
FIG. 11 is an enlarged view of a main component of the wireless IC device illustrated in FIG. 10.

FIG. 11 is an enlarged view of a mounting area of the electromagnetically coupled module 1 illustrated in FIG. 10. As indicated by L in the drawing, a portion of the metal article 63 and the metal ribbons 9 provided in a portion of the metal article 63 function as a loop electrode.

With this configuration, the metal ribbons 9 and a portion of the metal article 63 function as an auxiliary radiator for magnetic fields and are coupled to the metal article 63. Thus, the metal article 63 acts as a radiator.

Sixth Preferred Embodiment

Figure 12:
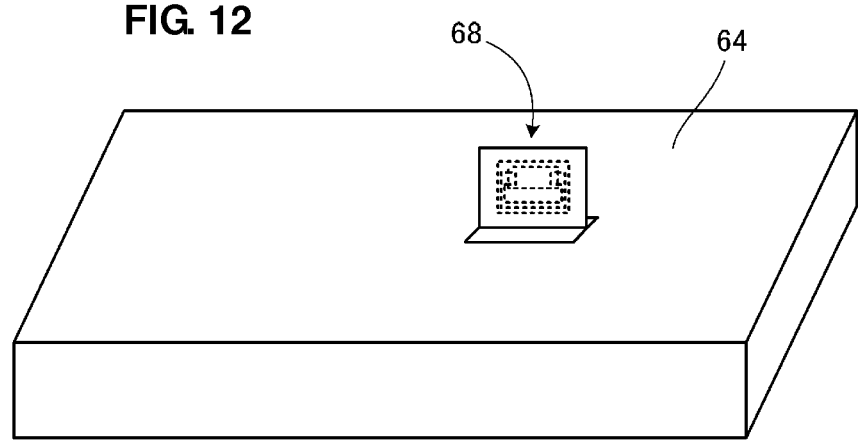
FIG. 12 illustrates a configuration of a wireless IC device according to a sixth preferred embodiment of the present invention and an article provided with the wireless IC device.

FIG. 12 is an external view of a metal article provided with a wireless IC device according to a sixth preferred embodiment of the present invention. A metal article is provided with a wireless-IC-device main component 68 on its surface.

Figure 13:
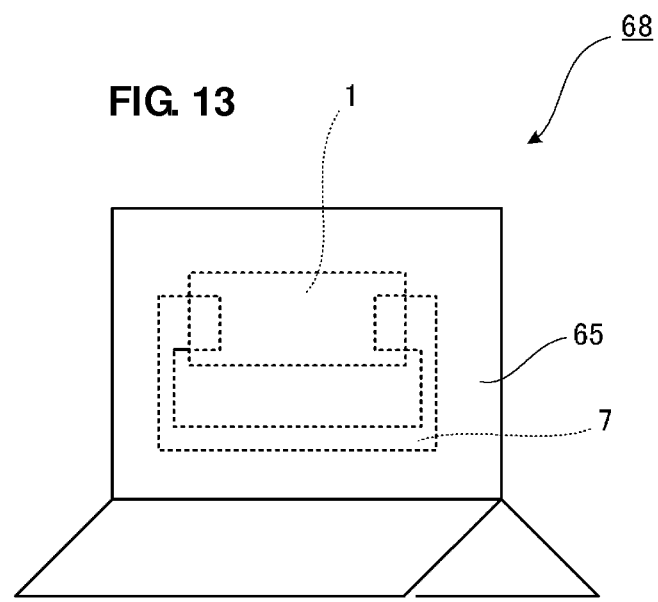
FIG. 13 is an enlarged view of a main component of the wireless IC device for the article illustrated in FIG. 12.

FIG. 13 is an enlarged view of the wireless-IC-device main component 68. The overall shape of the wireless-IC-device main component 68 is a "tack index label" shape. An insulating sheet 65 includes internal adhesive layers, between which the loop electrode 7 and the electromagnetically coupled module 1 are interposed. The configuration of the loop electrode 7 and electromagnetically coupled module 1 is substantially the same as that illustrated in FIG. 3.

The wireless-IC-device main component 68 is mounted on the metal article 64 such that the loop electrode 7 is perpendicular for substantially perpendicular to the surface of the metal article 64 illustrated in FIG. 12.

With the configuration described above, the loop electrode 7 functions as an auxiliary radiator for magnetic fields and is coupled to the metal article 64. Thus, the surface of the metal article 64 functions as a radiator.

Here, a loop along the metal article preferably defines the loop electrode 7. Alternatively, as described in the foregoing preferred embodiments, the metal article 64 may be configured to function both as a portion of the loop electrode and a radiator.

Seventh Preferred Embodiment

Figure 14:
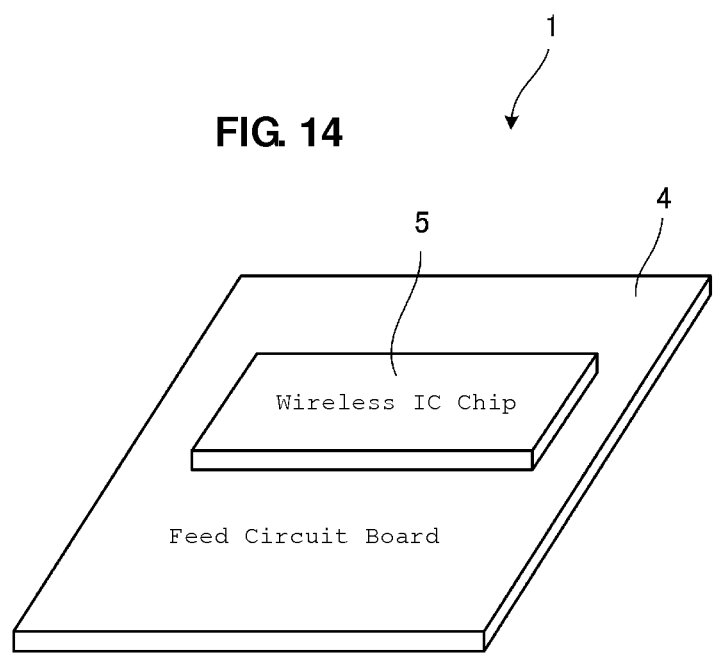
FIG. 14 is an external perspective view of an electromagnetically coupled module in a wireless IC device.

FIG. 14 is an external perspective view of the electromagnetically coupled module 1 for a wireless IC device according to a seventh preferred embodiment of the present invention. The electromagnetically coupled module 1 is applicable to the wireless IC device of any of the other preferred embodiments. The electromagnetically coupled module 1 includes a wireless IC chip 5 and a feed circuit board 4. Preferably, the feed circuit board 4 not only provides impedance matching between the wireless IC chip 5 and a metal article functioning as a radiator, but also functions as a resonant circuit.

Figure 15:
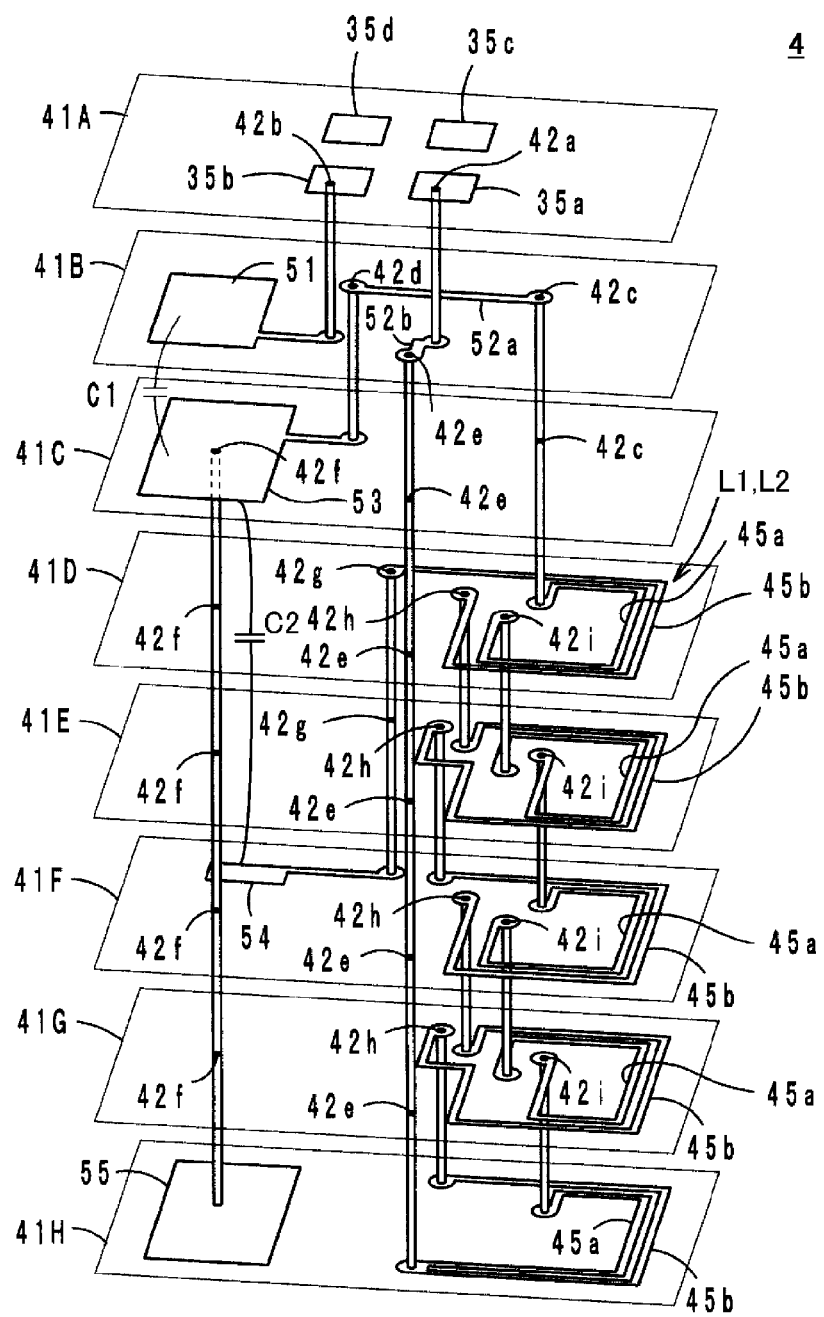
FIG. 15 is an exploded view illustrating an internal configuration of a feed circuit board.

FIG. 15 is an exploded view illustrating an internal configuration of the feed circuit board 4. The feed circuit board 4 is preferably a multilayer substrate formed by stacking a plurality of dielectric layers each having an electrode pattern. A dielectric layer 41A at the top includes wireless-IC-chip mounting lands 35a to 35d. A dielectric layer 41B includes a capacitor electrode 51 electrically connected to the wireless-IC-chip mounting land 35b. A dielectric layer 41C includes a capacitor electrode 53. A capacitor C1 is defined between the capacitor electrode 51 and the capacitor electrode 53. Each of the dielectric layers 41D to 41H includes inductor electrodes 45a and 45b. The inductor electrodes 45a and 45b on a plurality of different layers define inductors L1 and L2 that are double-spiral in overall shape and are strongly dielectrically coupled to each other. The dielectric layer 41F includes a capacitor electrode 54 electrically connected to the inductor L1. The capacitor electrode 54 is interposed between the capacitor electrode 53 and a capacitor electrode 55, and defines the capacitor electrode 55. Electrodes of adjacent dielectric layers are electrically connected to each other through corresponding via holes 42a to 42i.

Figure 16:
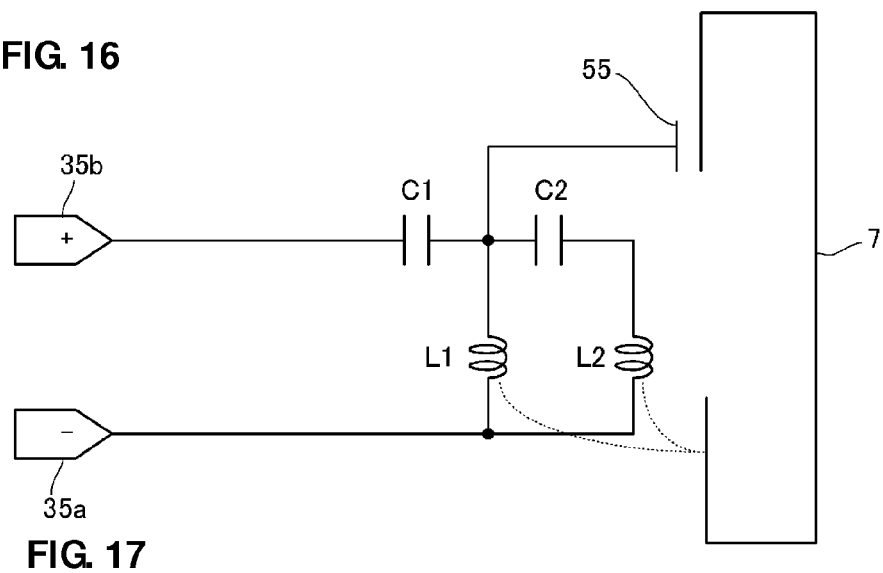
FIG. 16 is an equivalent circuit diagram of the feed circuit board.

FIG. 16 is an equivalent circuit diagram illustrating the feed circuit board 4 of FIG. 15 and the loop electrode. Referring to FIG. 16, the capacitor C1 corresponds to a capacitance provided between the capacitor electrodes 51 and 53 illustrated in FIG. 15; the capacitor C2 corresponds to a capacitance provided between the capacitor electrodes 54 and 53 and the capacitor electrode 55 illustrated in FIG. 15; and the inductors L1 and L2 correspond to the inductor electrodes 45a and 45b illustrated in FIG. 15.

The capacitor electrode 55 is preferably parallel or substantially parallel to and opposite an end of the loop electrode (i.e., the loop electrode 7 in the example of FIG. 3). The capacitor electrode 55 forms a capacitance between itself and this end of the loop electrode 7. The inductor electrodes L1 and L2 are electromagnetically coupled to the other end of the loop electrode 7.

In the feed circuit board 4, a resonance frequency is determined by a resonant circuit defined by the inductance elements L1 and L2 and their stray capacitance. The frequency of a signal emitted from a radiation electrode is preferably substantially determined by the self-resonant frequency of the resonant circuit.

The electromagnetically coupled module 1 including the wireless IC chip 5 mounted on the feed circuit board 4 receives, through the radiation electrode, high-frequency signals (e.g., in the UHF frequency band) emitted from a reader/writer (not shown), causes the resonant circuit in the feed circuit board 4 to resonate, and supplies received signals only in a predetermined frequency band to the wireless IC chip 5. At the same time, the electromagnetically coupled module 1 extracts predetermined energy from the received signals, uses the extracted energy as a drive source to match information stored in the wireless IC chip 5 to a predetermined frequency in the resonant circuit, and transmits the information to the radiation electrode, from which the information is transmitted to the reader/writer.

Thus, providing a resonant circuit in the feed circuit board improves frequency selectivity and enables an operating frequency of the wireless IC device to be substantially determined by the self-resonant frequency. Accordingly, transmission and reception of the energy of signals having a frequency used in the RFID system can be performed with a high degree of efficiency. At the same time, it is possible to set an optimum resonance frequency for the shape and size of the radiator, so as to improve the radiation characteristics of the wireless IC device.

Eighth Preferred Embodiment

Figure 17:
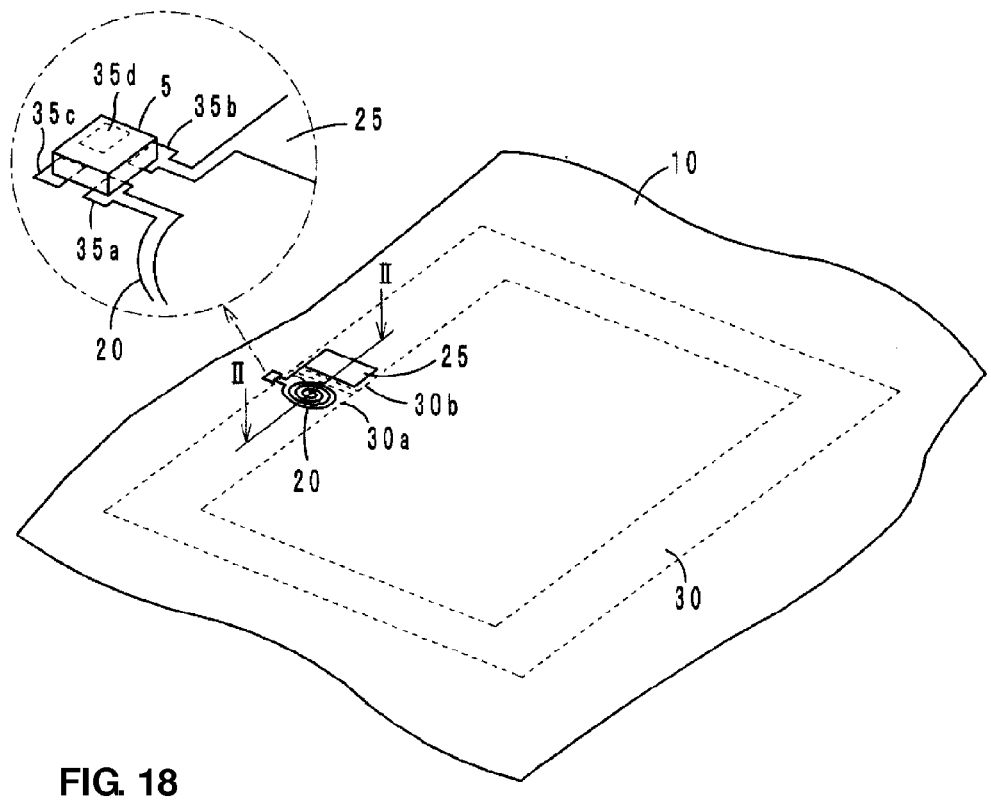
FIG. 17 illustrates a configuration of an electromagnetically coupled module in a wireless IC device according to a seventh preferred embodiment of the present invention.

FIG. 17 illustrates a configuration of an electromagnetically coupled module for a wireless IC device according to an eighth preferred embodiment of the present invention. Referring to FIG. 17, a loop electrode 30 is provided on an inner layer of a base 10. An insulating layer is disposed over two open ends 30a and 30b of the loop electrode 30, and an inductor electrode 20 and a capacitor electrode 25 are disposed over the insulating layer. The inductor electrode 20 has a spiral or substantially spiral shape and its inner end is connected to the capacitor electrode 25 as described below.

As illustrated in an enlarged view in FIG. 17, the wireless IC chip 5 is mounted on the ends of the inductor electrode 20 and capacitor electrode 25. Specifically, the wireless-IC-chip mounting land 35a is provided at the end of the inductor electrode 20, the wireless-IC-chip mounting land 35b is provided at the end of the capacitor electrode 25, and the wireless-IC-chip mounting lands 35c and 35d are additionally provided. Then, the wireless IC chip 5 is mounted on the wireless-IC-chip mounting lands 35a to 35d.

Figure 18:
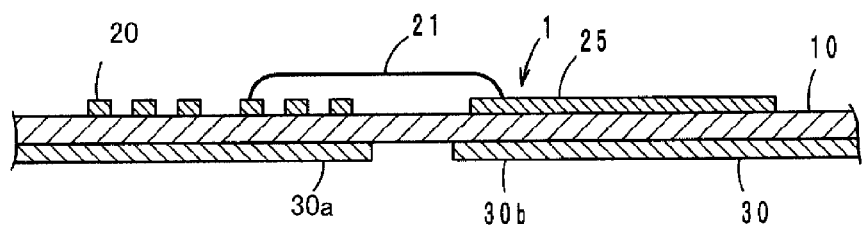
FIG. 18 is a cross-sectional view illustrating a main component of the electromagnetically coupled module illustrated in FIG. 17.

FIG. 18 is a cross-sectional view taken along line II-II of FIG. 17. Referring to FIG. 18, a wire 21 connects the inductor electrode 20 and the capacitor electrode 25.

Figure 19:
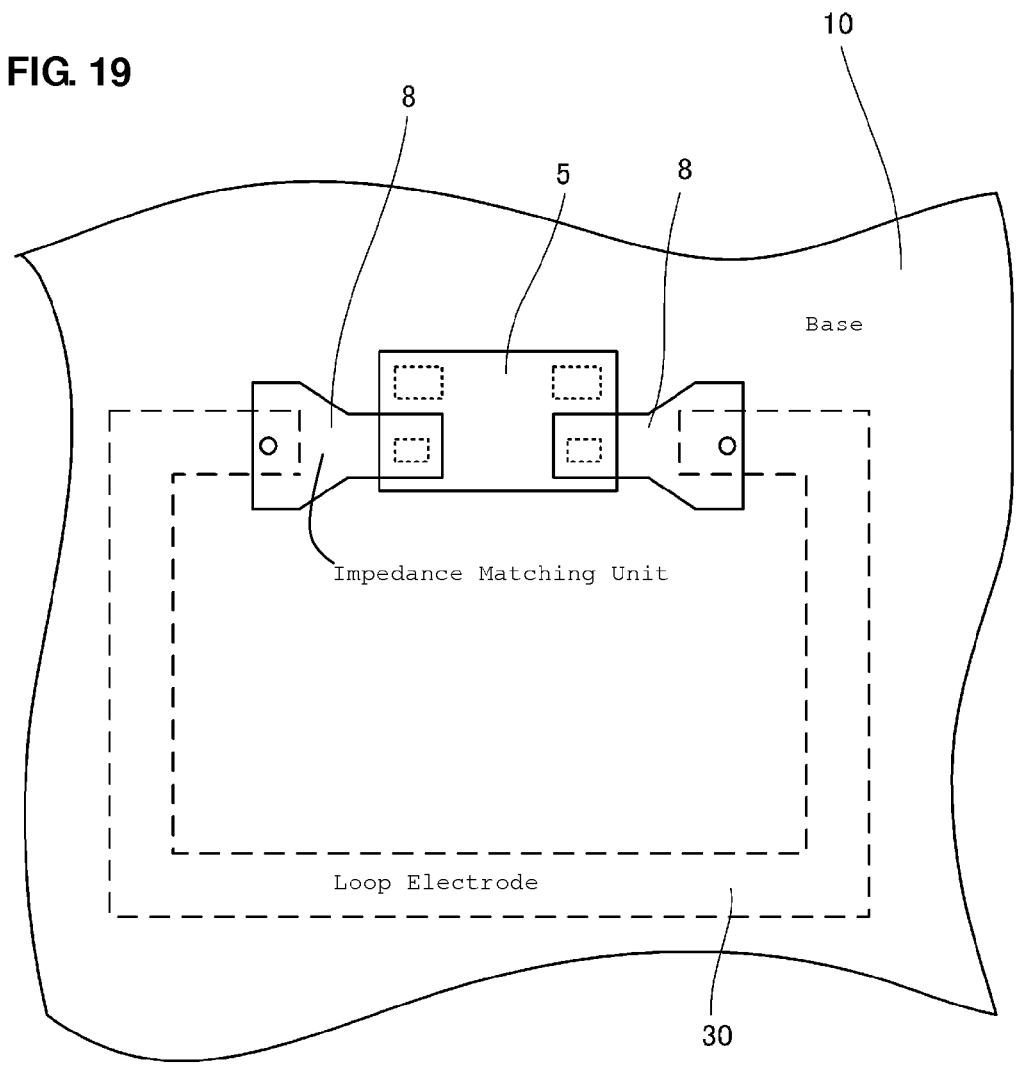
FIG. 19 illustrates a configuration of an electromagnetically coupled module in a wireless IC device according to an eighth preferred embodiment of the present invention.

FIG. 19 illustrated a modification of the eighth preferred embodiment. The wireless IC chip 5 and the loop electrode 30 may preferably be electrically connected through impedance matching units 8.

Preferably, the impedance matching units 8 may be separately produced using, for example, a ceramic multilayer substrate, a glass epoxy substrate, or other suitable substrate and attached to the loop electrode 30 by a conductive adhesive. Thus, the impedance matching units 8 enable electrical connection between the wireless IC chip 5 and the loop electrode 30.

Ninth Preferred Embodiment

Figure 20:
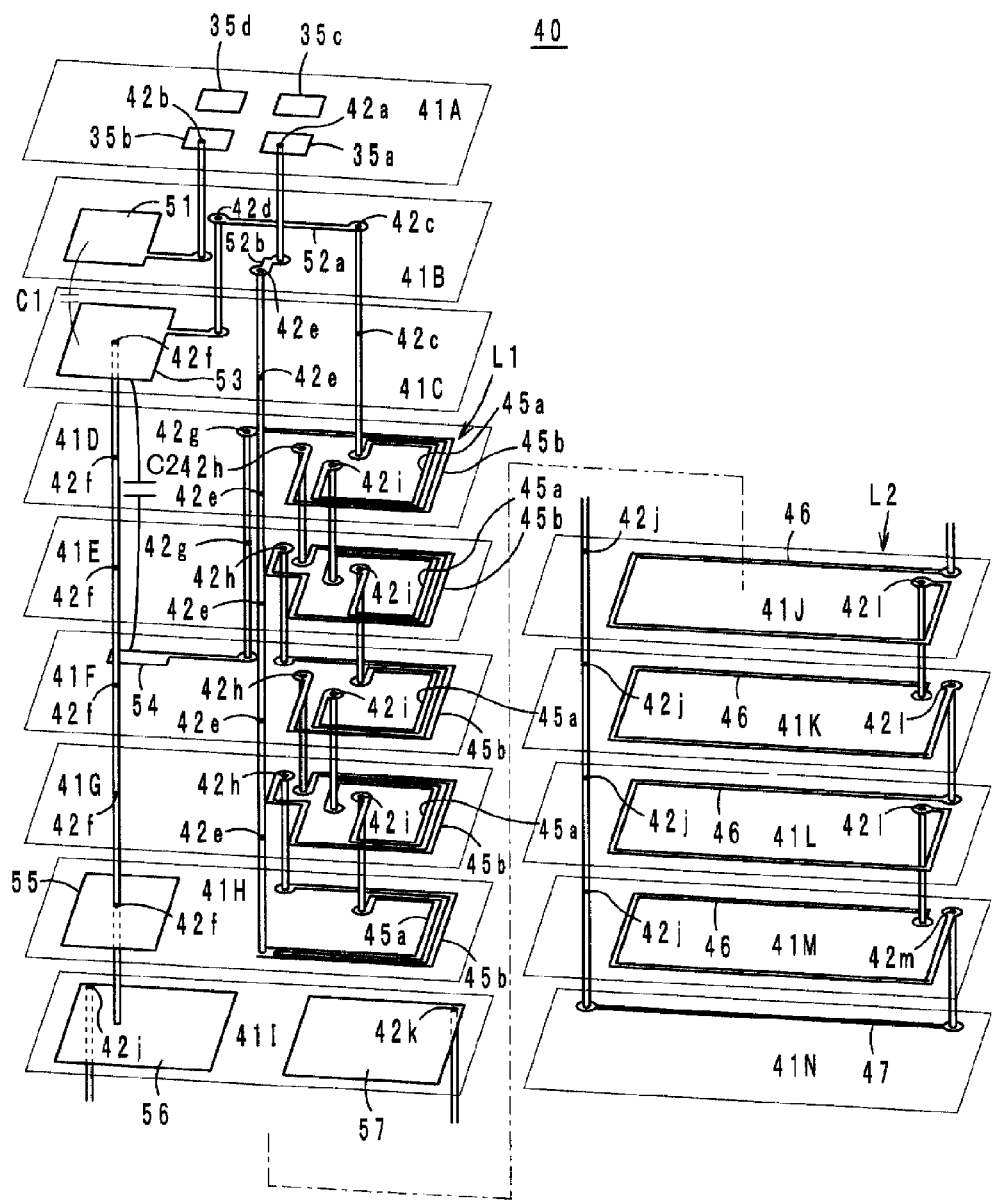
FIG. 20 is an exploded perspective view illustrating a feed circuit board in a wireless IC device according to a ninth preferred embodiment of the present invention.
Figure 21:
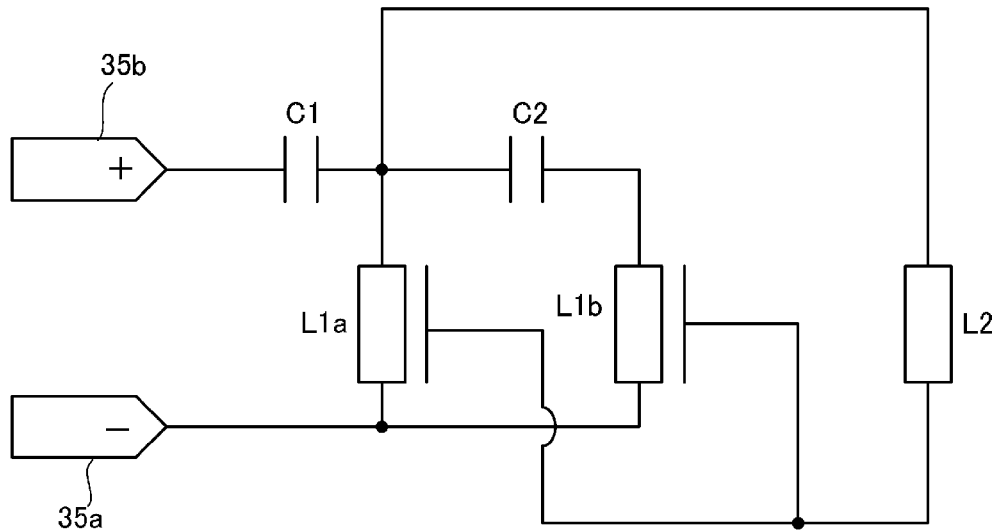
FIG. 21 is an equivalent circuit diagram of a main component of the wireless IC device illustrated in FIG. 20.

FIG. 20 is an exploded perspective view illustrating a feed circuit board 40 in a wireless IC device according to a ninth preferred embodiment of the present invention. FIG. 21 is an equivalent circuit diagram of FIG. 20.

The feed circuit board 40 is preferably a multilayer substrate formed by stacking a plurality of dielectric layers each including an electrode pattern. The dielectric layer 41A at the top includes the wireless-IC-chip mounting lands 35a to 35d. The dielectric layer 41B includes the capacitor electrode 51 electrically connected to the wireless-IC-chip mounting land 35b. The dielectric layer 41C includes the capacitor electrode 53. The capacitor C1 is provided between the capacitor electrode 51 and the capacitor electrode 53. Each of the dielectric layers 41D to 41H includes the inductor electrodes 45a and 45b. The inductor electrodes 45a and 45b provide the inductor L1 that preferably has a double-spiral overall shape.

The dielectric layer 41F includes the capacitor electrode 54 electrically connected to the inductor L1. The capacitor electrode 54 is interposed between the capacitor electrodes 53 and 55 (56), and defines a capacitor. The dielectric layer 41H includes the capacitor electrode 55 electrically connected to the capacitor electrode 53.

Each of the dielectric layers 41J to 41N includes inductor electrodes 46 and 47. The inductor electrodes 46 and 47 define the loop electrode L2 that is wound multiple times. Electrodes of adjacent dielectric layers are electrically connected to each other through corresponding via holes 42a to 42m.

That is, the feed circuit board 40 is obtained by adding a loop electrode to the feed circuit board 4 illustrated in FIG. 15.

Referring to FIG. 21, the capacitor C1 corresponds to a capacitance provided between the capacitor electrodes 51 and illustrated in FIG. 20; the capacitor C2 corresponds to a capacitance provided between the capacitor electrodes 54 and 53 and the capacitor electrode 55 illustrated in FIG. 20; inductors L1a and L1b correspond to the inductor electrodes 45a and 45b illustrated in FIG. 20; and the inductor L2 corresponds to the inductor electrodes 46 and 47 illustrated in FIG. 20.

Tenth Preferred Embodiment

Figure 22:
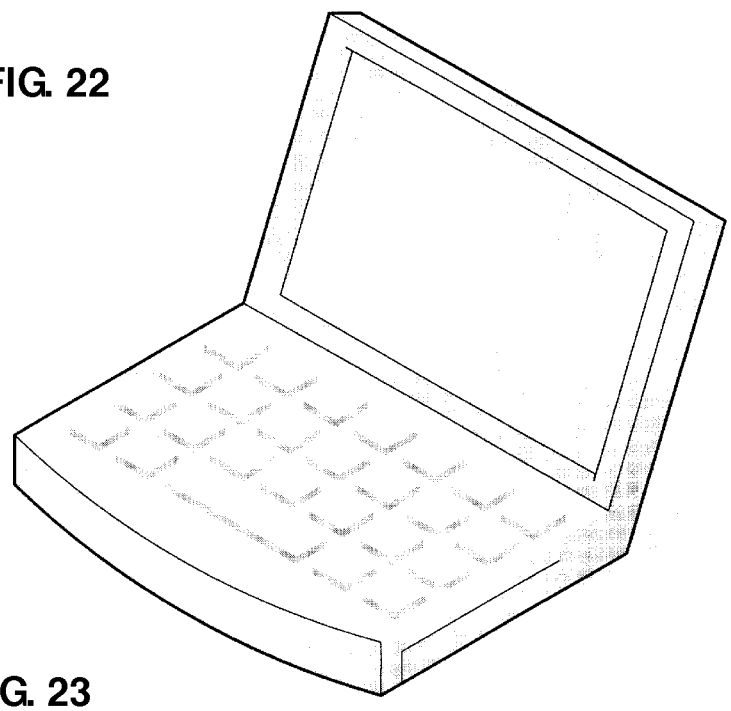
FIG. 22 illustrates a configuration of a wireless IC device according to a tenth preferred embodiment of the present invention and an article provided with the wireless IC device.
Figure 23:
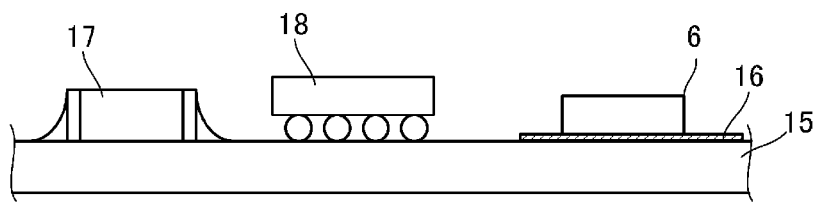
FIG. 23 is a cross-sectional view illustrating a main component of a circuit board in a notebook personal computer provided with the wireless IC device illustrated in FIG. 22.

FIG. 22 is an external perspective view of a notebook personal computer provided with a wireless IC device. FIG. 23 is a cross-sectional view illustrating a main portion of a circuit board inside the notebook personal computer. Electronic components 17 and 18 and the wireless-IC-device main component 6 are preferably mounted on a circuit board 15 inside the notebook personal computer in a direction substantially perpendicular to the circuit board 15. An electrode pattern 16 is provided on an upper surface of the circuit board 15. The electrode pattern 16 is coupled to the wireless-IC-device main component 6 and functions as a radiator.

As another example, a wireless IC device may be formed on a metal panel on the back of a component (e.g., liquid crystal panel) inside the notebook personal computer illustrated in FIG. 22. That is, the wireless IC device according to any of the first to tenth preferred embodiments may be applied to cause the metal panel to act as a radiator.

The same is applicable to any suitable metal article (e.g., a safe or a container) in addition to those described in the foregoing preferred embodiments.

Eleventh Preferred Embodiment

Figure 24:
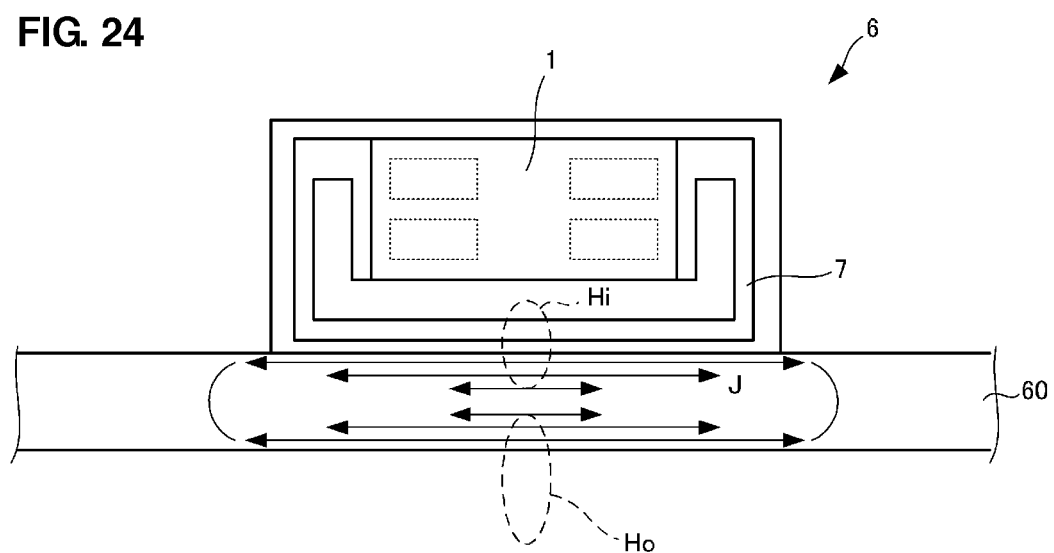
FIG. 24 is a cross-sectional view illustrating a main part of a wireless IC device according to an eleventh preferred embodiment of the present invention.

FIG. 24 is a cross-sectional view illustrating a main component of a wireless IC device according to an eleventh preferred embodiment of the present invention.

In first preferred embodiment shown in FIG. 2, the wireless-IC-device main component 6 is mounted on the surface (i.e., electromagnetic wave transmission/reception surface outside the metal article 60) arranged to receive signals from the reader/writer. In the eleventh preferred embodiment, the wireless-IC-device main component 6 is mounted on a surface opposite the surface arranged to receive signals from the reader/writer.

As in first preferred embodiment, the wireless-IC-device main component 6 includes an insulating substrate, which is provided with the loop electrode 7 and the electromagnetically coupled module 1 coupled to the loop electrode 7.

With this configuration, a signal (magnetic field Ho) from the reader/writer causes an eddy current J to flow across the conductor principal plane of the metal article 60. The eddy current J causes a magnetic field Hi to be generated in a direction perpendicular or substantially perpendicular to the conductor principal plane of the metal article 60. Then, the loop electrode 7 is coupled to the magnetic field Hi. Thus, the wireless-IC-device main component 6 functions as an RFID tag even for signals transmitted towards the principal plane opposite to the wireless-IC-device main component 6.

An article on which the wireless-IC-device main component 6 is mounted is not limited to a metal article, and may be any article having a surface made of conductive material, such as carbon.

The loop electrode 7 may either be in contact with or spaced apart from the conductive surface of the article.

Twelfth Preferred Embodiment

Figure 25A:
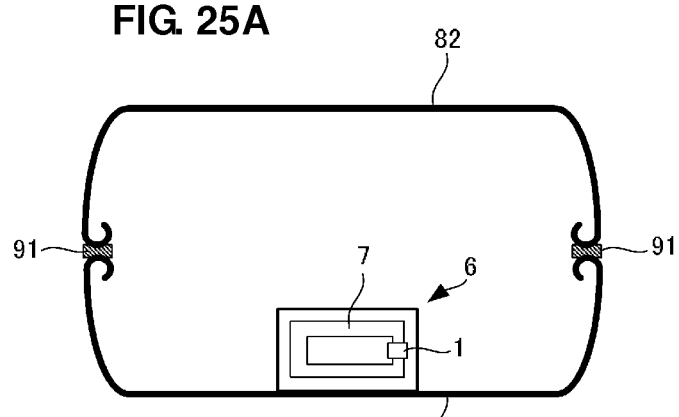
FIGS. 25A to 25C are cross-sectional views each illustrating a main part of a wireless IC device according to a twelfth preferred embodiment of the present invention.
Figure 25B:
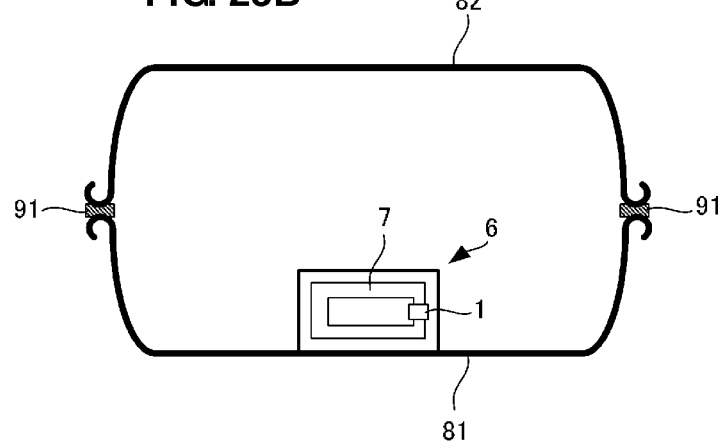
Figure 25C:
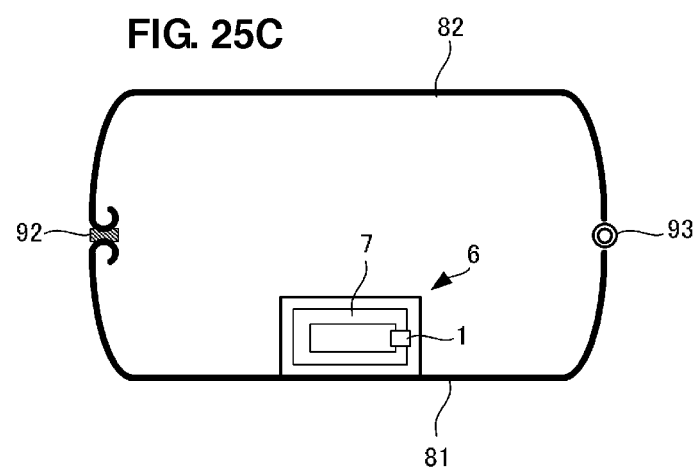

FIGS. 25A to 25C are cross-sectional views illustrating a main component of a wireless IC device according to a twelfth preferred embodiment of the present invention.

In the first preferred embodiment shown in FIG. 2, the wireless-IC-device main component 6 is mounted on the surface (i.e., outer surface) of the metal article 60. However, in the twelfth preferred embodiment, the wireless-IC-device main component 6 is mounted inside (i.e., on the inner surface) of the metal article 60.

FIG. 25A illustrates metal cases (half cases) 81 and 82 having joining portions protruding inside the cases. FIG. 25B illustrates the metal cases (half cases) 81 and 82 having joining portions protruding outside the cases. FIG. 25C illustrates the metal cases (half cases) 81 and 82 having a hinge mechanism arranged to maintain conductivity at one end. In each case, corresponding joining portions are joined to each other with an electrical insulator (e.g., rubber packing) or an electrical resistor interposed therebetween.

As in the first preferred embodiment, the wireless-IC-device main component 6 includes an insulating substrate, which is provided with the loop electrode 7 and the electromagnetically coupled module 1 coupled to the loop electrode 7.

With this configuration, as in the eleventh preferred embodiment, a signal (magnetic field) from the reader/writer causes an eddy current to flow across the conductor principal plane of the metal cases 81 and 82. The eddy current causes a magnetic field to be generated in a direction perpendicular or substantially perpendicular to the conductor principal plane of the metal cases 81 and 82. Then, the magnetic field is coupled to the loop electrode 7. This enables the metal cases 81 and 82 to be used as metal articles having an internal RFID tag.

In FIGS. 25A and 25B, the upper metal case 82 is preferably galvanically isolated from the metal case 81 in which the wireless-IC-device main component 6 is provided. However, since a chain of electric field loops and magnetic field loops spreads along the conductor plane of the metal cases, the upper metal case 82 also functions as a radiator.

Thus, by providing the wireless IC device 6 inside a case, the durability and environmental resistance of the wireless IC device are improved.

The same applies to the situation in which the wireless-IC-device main component 6 illustrated in FIGS. 25A to 25C is, for example, an RFID tag for a food product and the metal cases 81 and 82 correspond to a housing of a refrigerator or freezer. Here, it is possible to externally read information about each food product without opening the door of the refrigerator or freezer.

The same also applies to the situation in which the wireless-IC-device main component 6 illustrated in FIGS. 25A to 25C is, for example, an RFID tag for an electronic component or circuit board and the metal cases 81 and 82 correspond to a housing of a personal computer or mobile phone terminal. Here, it is possible to externally read information about each electronic component or circuit board without opening the housing of the personal computer or mobile phone terminal.

Although FIGS. 25A to 25C illustrate substantially can-shaped metal cases as examples, the same also applies to tubular or cup-shaped conductive cases. For example, by providing the wireless-IC-device main component 6 inside a carbon shaft of a golf club, the golf club can be used as a golf club having an internal RFID tag that is externally readable and writable.

Thirteenth Preferred Embodiment

Figure 26:
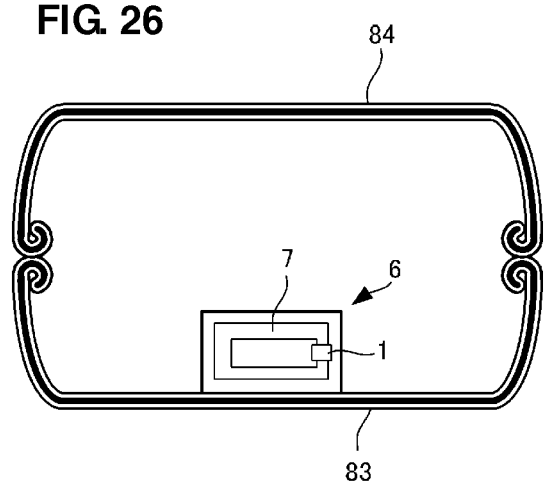
FIG. 26 is a cross-sectional view illustrating a main component of a wireless IC device according to a thirteenth preferred embodiment of the present invention.

FIG. 26 is a cross-sectional view illustrating a main component of a wireless IC device according to a thirteenth preferred embodiment of the present invention.

As shown in FIG. 26, metal cases 83 and 84 that are surface-coated with electrical insulating material or electrical resistive material are provided. The remaining configuration is substantially the same as that illustrated in FIGS. 25A to 25C.

Thus, an interface between the upper and lower cases may be insulated or substantially insulated by the coating over the case surface.

Fourteenth Preferred Embodiment

Figure 27:
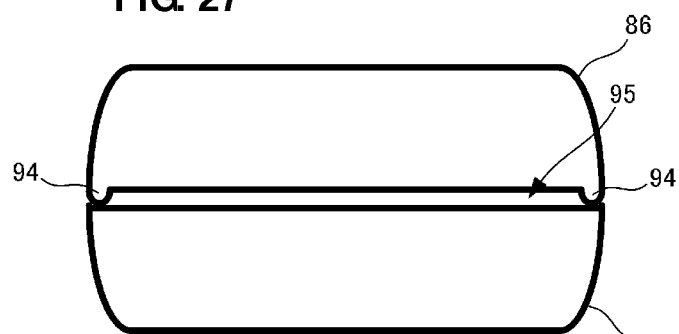
FIG. 27 is a cross-sectional view illustrating a main component of a wireless IC device according to a fourteenth preferred embodiment of the present invention.

FIG. 27 is a cross-sectional view illustrating a main component of a wireless IC device according to a fourteenth preferred embodiment of the present invention.

In FIG. 27, protrusions 94 at joining portions between a lower metal case 85 and an upper metal case 86 create a clearance 95. The remaining configuration is substantially the same as that illustrated in FIGS. 25A to 25C.

Thus, even if there is a clearance in the metal cases, the metal article can be used as an article having an internal RFID tag.

Fifteenth Preferred Embodiment

Figure 28:
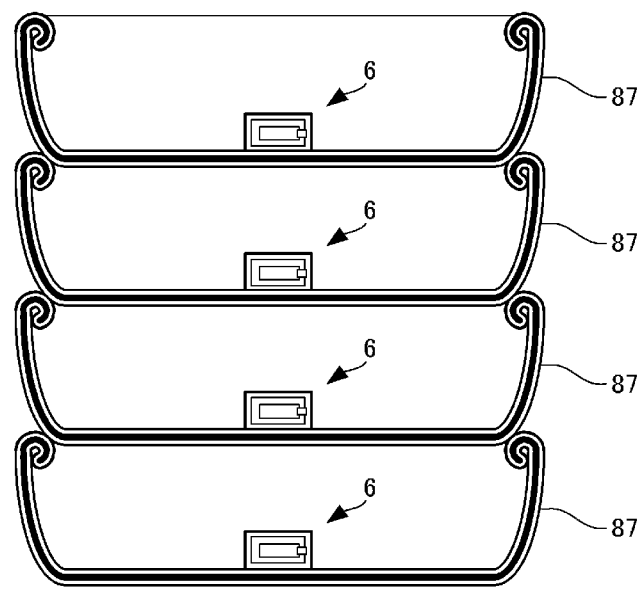
FIG. 28 is a cross-sectional view illustrating a main component of a wireless IC device according to a fifteenth preferred embodiment of the present invention.

FIG. 28 is a cross-sectional view illustrating a main component of a wireless IC device according to a fifteenth preferred embodiment of the present invention.

In the example of FIG. 28, the wireless-IC-device main component 6 is mounted inside a metal tray 87 to form a metal tray having an RFID tag. The metal tray 87 is surface-coated with electrical insulating material or electrical resistive material. In the example of FIG. 28, a plurality of metal trays are stacked on top of each other.

By stacking the metal trays as described above, the metal trays are galvanically isolated from each other by the coating of the electrical insulating material or electrical resistive material, and each wireless-IC-device main component 6 is surrounded by metal material. However, as in the twelfth to fourteenth preferred embodiments described above, the reader/writer can communicate with an RFID tag in each metal tray.

Sixteenth Preferred Embodiment

Figure 29:
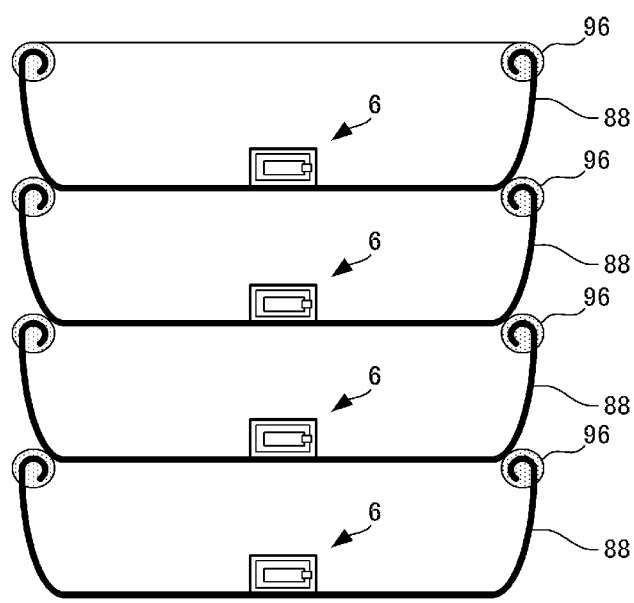
FIG. 29 is a cross-sectional view illustrating a main component of a wireless IC device according to a sixteenth preferred embodiment of the present invention.

FIG. 29 is a cross-sectional view illustrating a main component of a wireless IC device according to a sixteenth preferred embodiment of the present invention.

In FIG. 29, the wireless-IC-device main component 6 is mounted inside a metal tray 88 to form a metal tray having an RFID tag. The metal tray 88 includes a rim 96 of electrical insulating material or electrical resistive material at its edge. In FIG. 29, a plurality of metal trays are stacked on top of each other.

By stacking the metal trays as described above, the metal trays are galvanically isolated from each other by the electrical insulating material or electrical resistive material, and each wireless-IC-device main part 6 is surrounded by metal material. However, as in the twelfth to fourteenth preferred embodiments described above, the reader/writer can individually communicate with an RFID tag in each metal tray.

In the preferred embodiments shown in FIGS. 25A to 29, portions are preferably galvanically isolated by the electrical insulating or resistive material. However, the wireless-IC-device main component 6 provided inside a case or housing tightly surrounded by conductive material can still be used as an RFID tag although the antenna gain may be slightly reduced.

A loop electrode having a rectangular or substantially rectangular shape is preferably used in the preferred embodiments described above. However, the loop electrode may have any suitable shape, such as circular, elliptical, or polygonal shape, for example, depending on the article in which the electrode is disposed. Additionally, the loop electrode may extend from the bottom to the side of a case. Even when the shape of the signal transmission/reception surface is modified, the wireless-IC-device main component 6 still functions as an RFID tag.

In addition, in the preferred embodiments described above, a loop electrode is preferably formed of a single-layer conductive pattern. However, the loop electrode may have a multilayer coil structure, for example, instead of a single-layer loop structure.

A loop electrode preferably forms an open loop in the preferred embodiments described above. However, the loop electrode may form a closed loop, as long as the loop electrode is configured to be magnetically coupled to an inductor in a feed circuit board. That is, an inductor pattern parallel or substantially parallel to the loop plane of the loop electrode may be provided on the feed circuit board such that the inductor pattern is magnetically coupled to the loop electrode forming a closed loop.

In addition, in the preferred embodiments described above, a wireless-IC-device main component having a loop electrode is in contact with a predetermined surface of a case. However, the wireless-IC-device main component may be spaced apart from the predetermined surface, or may be hung from the inner surface of the case (i.e., suspended in the air inside the case).

Also, in the preferred embodiments described above, a wireless-IC-device main component having a loop electrode is mounted on a principal surface of a case that has a relatively large area. However, the wireless-IC-device main component may be mounted on a side of the case.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A wireless IC device comprising:
a high-frequency device defined by an electromagnetically coupled module or a wireless IC chip, the electromagnetically coupled module including the wireless IC chip and a feed circuit board coupled to an external circuit and electrically connected to or electromagnetically coupled to the wireless IC chip;
a loop electrode coupled to the high-frequency device;
an insulation sheet on which the high-frequency device and the loop electrode are arranged; and
a radiation electrode coupled to the loop electrode, said radiation electrode defining a radiator; wherein
the insulation sheet has a plane bonded to a plane of the radiation electrode by being separated into different directions at one end such that a loop plane of the loop electrode is perpendicular or inclined relative to the plane of the radiation electrode by being bonded to the plane of the radiation electrode; and the loop electrode is provided near inside an area of the radiation electrode.

2. The wireless IC device according to claim 1, wherein the loop electrode is electromagnetically coupled to the radiation electrode with an insulating layer interposed therebetween.

3. The wireless IC device according to claim 1, wherein the loop electrode is directly electrically connected to the radiation electrode, and a portion of the radiation electrode functions as a portion of the loop electrode.

4. The wireless IC device according to claim 1, further comprising a matching circuit arranged between a mounting area of the high-frequency device and the loop electrode, the matching circuit being arranged to directly electrically connect the high-frequency device to the loop electrode.

5. The wireless IC device according to claim 1, further comprising at least one of a resonant circuit or a matching circuit in the feed circuit board.

6. The wireless IC device according to claim 5, wherein a resonance frequency of the resonant circuit is substantially equal to a frequency of a signal transmitted and received by the radiation electrode.

7. The wireless IC device according to claim 1, wherein the at least one of the high-frequency device or the loop electrode is covered with plastic.

8. The wireless IC device according to claim 1, wherein the high-frequency device and the loop electrode are made of molded plastic disposed on the radiation electrode.

9. The wireless IC device according to claim 1, wherein the radiation electrode is a cylindrical or substantially cylindrical metal article having a conductive layer.

10. The wireless IC device according to claim 1, wherein the radiation electrode is an electrode pattern provided on a circuit board inside electronic equipment.

11. The wireless IC device according to claim 1, wherein the radiation electrode is a metal plate provided in a component inside electronic equipment.

12. The wireless IC device according to claim 1, wherein the loop electrode is disposed on a surface opposite to an electromagnetic wave transmission/reception surface outside the radiation electrode.

13. The wireless IC device according to claim 12, wherein the loop electrode is covered with the radiation electrode or a conductive surface including the radiation electrode.

* * * * *